United States Patent
Sankar et al.

(10) Patent No.: US 12,392,566 B2
(45) Date of Patent: Aug. 19, 2025

(54) FREQUENCY LOCK IN ACTIVE MEMS COOLING SYSTEMS

(71) Applicant: Frore Systems Inc., San Jose, CA (US)

(72) Inventors: Ganapathy Sankar, Cupertino, CA (US); Shekhar Halakatti, Campbell, CA (US); Suchitra Ramesh, San Jose, CA (US); Suryaprakash Ganti, Los Altos, CA (US); Prabhu Sathyamurthy, San Jose, CA (US); Seshagiri Rao Madhavapeddy, La Jolla, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 18/620,840

(22) Filed: Mar. 28, 2024

(65) Prior Publication Data

US 2024/0240884 A1 Jul. 18, 2024

Related U.S. Application Data

(63) Continuation of application No. 17/552,290, filed on Dec. 15, 2021, now Pat. No. 11,976,892.

(60) Provisional application No. 63/128,376, filed on Dec. 21, 2020, provisional application No. 63/126,461, filed on Dec. 16, 2020.

(51) Int. Cl.
*F28F 13/12* (2006.01)
*H10N 30/20* (2023.01)
*H10N 30/80* (2023.01)

(52) U.S. Cl.
CPC ......... *F28F 13/12* (2013.01); *H10N 30/2042* (2023.02); *H10N 30/802* (2023.02)

(58) Field of Classification Search
CPC . H10N 30/802; F28D 2021/0029; F28F 13/12
See application file for complete search history.

(56) References Cited

U.S. PATENT DOCUMENTS

| 7,282,837 B2 | 10/2007 | Scher |
| RE45,376 E | 2/2015 | Arik |
| 10,947,965 B2 | 3/2021 | Tanaka |
| 2005/0089415 A1 | 4/2005 | Cho |
| 2005/0225213 A1 | 10/2005 | Richards |
| 2008/0304979 A1 | 12/2008 | Lucas |
| 2011/0063800 A1 | 3/2011 | Park |
| 2013/0210175 A1 | 8/2013 | Hoisington |

(Continued)

*Primary Examiner* — Lionel Nouketcha
(74) *Attorney, Agent, or Firm* — Van Pelt, Yi & James LLP

(57) ABSTRACT

A system includes an active micro-electric mechanical system (MEMS) cooling system and a drive system. The MEMS cooling system includes cooling element(s) that direct fluid toward a surface of heat-generating structure(s) when driven to vibrate by a driving signal having a frequency and an input voltage. The drive system is coupled to the active MEMS cooling system and provides the driving signal. The drive system includes a power source and a feedback controller providing a feedback signal corresponding to a proximity to a resonant state of the at least one cooling element. The drive system adjusts at least one of the frequency and the input voltage based on the feedback signal such that the frequency corresponds to the resonant state of the cooling element(s). The input voltage does not exceed a maximum safe operating voltage for the cooling element(s).

13 Claims, 17 Drawing Sheets

(56) References Cited

U.S. PATENT DOCUMENTS

| | | |
|---|---|---|
| 2015/0115846 A1 | 4/2015 | Choi |
| 2019/0101938 A1 | 4/2019 | Mou |
| 2020/0051895 A1* | 2/2020 | Ganti ................ H01L 23/46 |
| 2021/0185856 A1 | 6/2021 | Ganti |

* cited by examiner

FREQUENCY LOCK IN ACTIVE MEMS COOLING SYSTEMS

CROSS REFERENCE TO OTHER APPLICATIONS

This application is a continuation of U.S. patent application Ser. No. 17/552,290 entitled FREQUENCY LOCK IN ACTIVE MEMS COOLING SYSTEMS filed Dec. 15, 2021, which claims priority to U.S. Provisional Patent Application No. 63/126,461 entitled FREQUENCY LOCK VIA POWER DRAW MEASUREMENT filed Dec. 16, 2020 and U.S. Provisional Patent Application No. 63/128,376 entitled FREQUENCY LOCK VIA POWER DRAW MEASUREMENT filed Dec. 21, 2020, all of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRA WINGS

Various embodiments of the invention are disclosed in the following detailed description and the accompanying drawings.

DETAILED DESCRIPTION

Figure 1A:
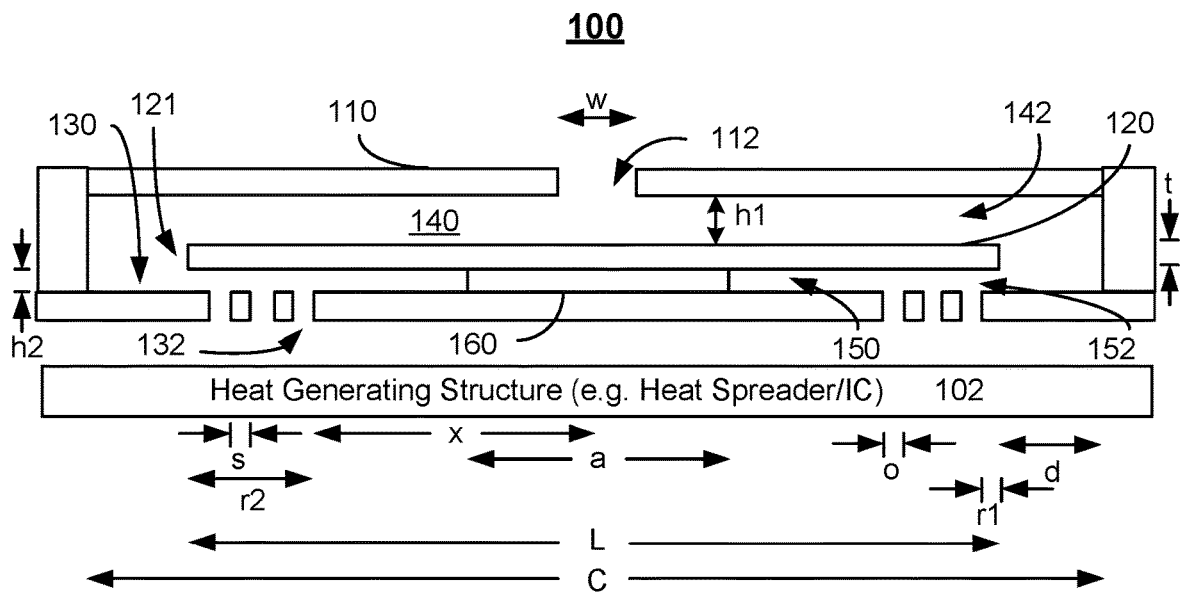
FIGS. 1A-1F depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Varying configurations of computing devices further complicate heat management. For example, computing devices such as laptops are frequently open to the external environment while other computing devices, such as smartphones, are generally closed to the external environment. Thus, active heat management solutions for open devices, such as fans, may be inappropriate for closed devices. A fan driving heated fluid from the inside of the computing device to the outside environment may be too large for closed computing devices such as smartphones and may provide limited fluid flow. In addition, the closed computing device has no outlet for the heated fluid even if the fan can be incorporated into the closed computing device. Thus, the thermal management provided by such an open-device mechanism may have limited efficacy. Even for open computing devices, the location of the inlet and/or outlet may be configured differently for different devices. For example, an outlet for fan-driven fluid flow in a laptop may be desired to be located away from the user's hands or other structures that may lie within the outflow of heated fluid. Such a configuration not only prevents the user's discomfort but also allows the fan to provide the desired cooling. Another mobile device having a different configuration may require the inlets and/or outlets to be configured differently, may reduce the efficacy of such heat management systems and may prevent the use of such heat management systems. Thus, mechanisms for improving cooling in computing devices are desired.

Space and other limitations in computing devices further limit the use of active cooling systems. Active cooling systems are those in which an electrical signal is used to drive cooling. A conventional fan is an example of an active cooling system, while a heat sink is an example of a passive cooling system. Space and power limitations restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Consequently, active cooling systems face particular challenges when used in computing devices such as active computing devices.

A system including an active micro-electric mechanical system (MEMS) cooling system and a drive system is described. The MEMS cooling system includes at least one cooling element configured to direct a fluid toward a surface of at least one heat-generating structure when driven to vibrate by a driving signal having a frequency and an input voltage. The drive system is coupled to the active MEMS cooling system and provides the driving signal. The drive system includes a power source for the driving signal and a feedback controller. The feedback controller has a feedback signal corresponding to a proximity to a resonant state of the at least one cooling element. The drive system is configured to adjust the frequency and/or the input voltage based on the feedback signal such that the frequency and the input voltage correspond to the resonant state of the cooling element(s). The frequency may be a structural resonant frequency for the cooling element(s) and/or an acoustic resonant frequency for the active MEMS cooling system. The input voltage is not less than a minimum desired operating voltage for the cooling element and does not exceed a maximum safe operating voltage for the cooling element. In some embodiments, the drive system is configured to adjust the input voltage to be the maximum safe operating voltage for the cooling element. In some embodiments, the cooling element(s) include piezoelectric(s) having a polarization direction(s). The drive system is configured to bias the driving signal to self-bias the piezoelectric(s) to have the polarization direction(s).

To adjust the frequency to correspond to the resonant state, the drive system may be configured to adjust the frequency to correspond to a power drawn by the active MEMS cooling system and utilized by the active MEMS cooling system to vibrate the cooling element(s) being maximized. The feedback controller may monitor voltage(s) at cooling element(s). In such embodiments, the drive system is configured to adjust the frequency to correspond to a minimum voltage across the cooling element(s).

The feedback controller may monitor other and/or additional characteristics. For example, the feedback controller may monitors the power output by the power source, the peak current output by the power source, the peak-to-peak current output by the power source, the peak voltage output by the power source, the average current output by the power source, the root mean square (RMS) current output by the power source, the average voltage output by the power source, the amplitude of displacement of the cooling element, the peak current through the cooling element(s), the RMS current through the at least one cooling element, the peak voltage at the cooling element(s), the average current through the cooling element(s), and/or the average voltage at the cooling element(s).

In some embodiments, the system also includes an additional active MEMS cooling system. The additional active MEMs cooling system includes at least one additional cooling element configured to direct the fluid toward an additional surface of the at least one heat-generating structure when driven to vibrate by an additional driving signal having an additional frequency and an additional input voltage. In such embodiments, the drive system is coupled to the additional active MEMS cooling system and is configured to provide the additional driving signal, to adjust at least one of the additional frequency and the additional input voltage such that the additional frequency corresponds to an additional resonant state of the additional cooling element(s), and to adjust an additional input voltage for the additional cooling element(s) such that the input additional voltage does not exceed an additional maximum safe operating voltage for the cooling element. The drive system is further configured to adjust the frequency and the additional frequency to vary a difference between the frequency and the additional frequency. In some embodiments, the additional surface is the same as the surface of the at least one heat-generating structure. Stated differently, both the active MEMS cooling system and the additional active MEMS cooling system may drive fluid toward the same surface and/or different portions of the same surface.

A system having an active MEMS cooling system including multiple tiles and a drive system is also described. Each of the tiles includes MEMS jet(s) configured to direct a fluid toward a surface of heat-generating structure(s) when driven by a driving signal having a frequency and an input voltage. The drive system is coupled to the tiles and provides each of the tiles with the driving signal. The drive system includes power source(s) for the driving signal and a feedback controller having a feedback signal corresponding to a proximity to a resonant state of the MEMS jet(s) of each of the tiles. The drive system is configured to adjust at least one of the frequency and the input voltage based on the feedback signal such that the frequency and the input voltage correspond to the resonant state of the MEMS jet(s) and is configured to provide an input voltage for the MEMS jet(s) such that the input voltage does not exceed a maximum safe operating voltage for each tile.

In some embodiments, the drive system is configured to provide a tile-specific frequency to each of the plurality of tiles. The tile specific frequency may be such that the input voltage for each of the tiles is the maximum safe operating voltage for each of the tiles. The drive system may be further configured to adjust the frequency for each of the plurality of tiles such that a difference between a first frequency of a first tile of the plurality of tiles and a second frequency of a second tile of the plurality of tiles is varied.

A method for driving an active MEMS cooling system is described. The active MEMS cooling system includes cooling element(s) configured to direct a fluid toward a surface of heat-generating structure(s) when driven to vibrate by a driving signal having a frequency and an input voltage. The method includes providing the driving signal to the active MEMS cooling system. Providing the driving signal includes using an input voltage for the cooling element such that the input voltage does not exceed a maximum safe operating voltage for the cooling element(s). The cooling element(s) may include piezoelectric(s) having polarization direction(s). In such embodiments, the providing the driving signal may further include biasing the driving signal such that the cooling element(s) are self-biased to have the polarization direction(s). The method also includes monitoring characteristic(s) of the active MEMS cooling system to provide a feedback signal corresponding to a proximity to resonant state of the active MEMS cooling system. The frequency and/or the input voltage are adjusted based on the feedback signal such that the frequency and input voltage correspond to the resonant state of the active MEMS cooling system. In some embodiments, adjusting the frequency further includes adjusting the frequency to correspond to at least one of a power drawn by the active MEMS cooling system and utilized by the active MEMS cooling system to vibrate the cooling element(s) being maximized, a voltage at the cooling element(s) being minimized for the input voltage, and/or an peak-to-peak amplitude of a current drawn by the at least one cooling element being minimized for the input voltage. In some embodiments, adjusting the frequency includes determining whether the feedback signal indicates a drift in the resonant state of the cooling element(s) exceeds a threshold and identifying a new frequency in response to a determination that the drift exceeds the threshold. The new frequency corresponds to the drift in the resonant state. The method also includes setting the new frequency as the frequency for the driving signal in response to the new frequency being identified.

In some embodiments, the method also identifies the frequency using a sweep. In particular, a first frequency is identified using the sweep of frequencies for the driving signal for the active MEMS cooling system at frequencies within a first range of an initial frequency. The sweep uses an initial voltage less than the input voltage. In such embodiments, the method also includes identifying the frequency using a fine tuning sweep for the active MEMS cooling system at a second plurality of frequencies in a second range including the first frequency for the driving signal. The second range is smaller than the first range. The input voltage may be set to the maximum safe operating voltage for the cooling element at the frequency.

The method may also include providing an additional driving signal to an additional MEMS cooling system. The additional MEMS cooling system includes additional cooling element(s) configured to direct the fluid toward an additional surface of the heat-generating structure(s) when driven to vibrate by the additional driving signal having an additional frequency. In such embodiments, providing the driving signal and/or providing the additional driving signal includes changing the frequency and/or the additional frequency to vary a difference between the frequency and the additional frequency.

Figure 1B:
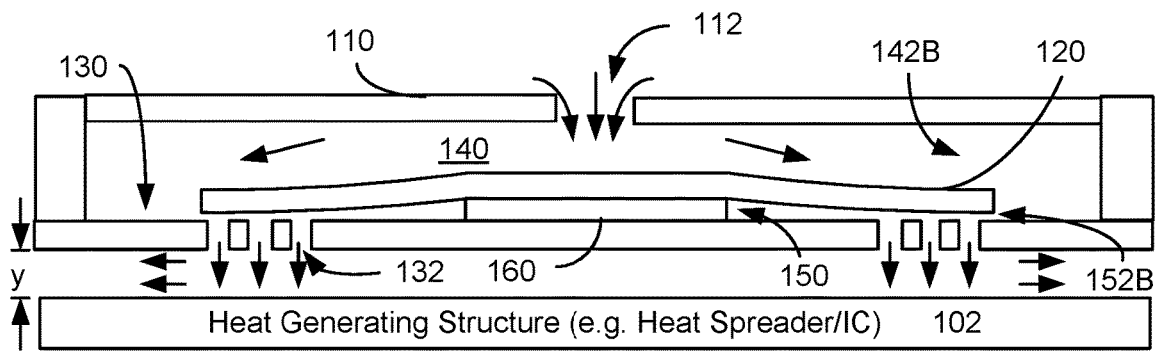
Figure 1C:
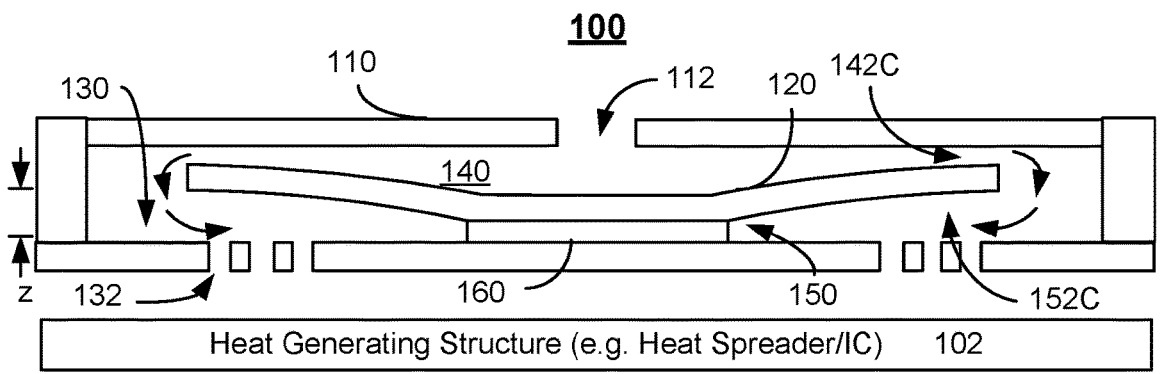
Figure 1D:
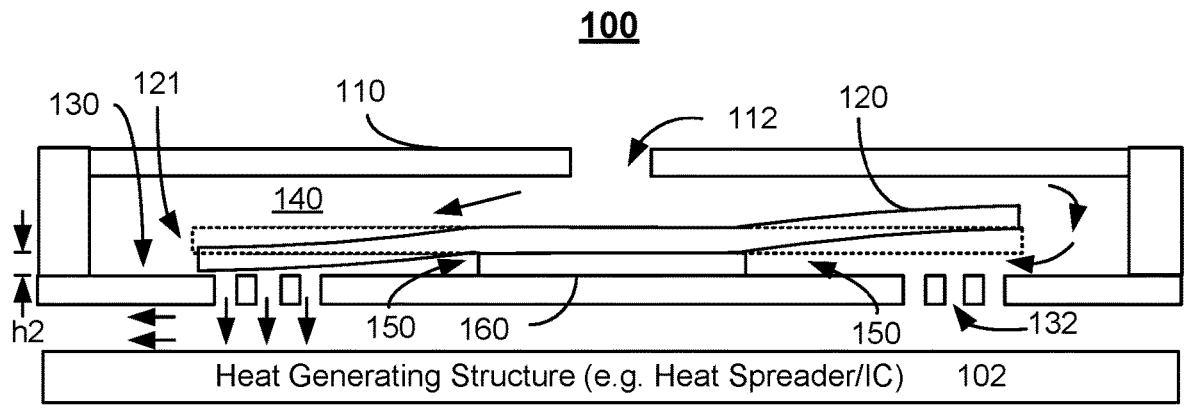
Figure 1E:
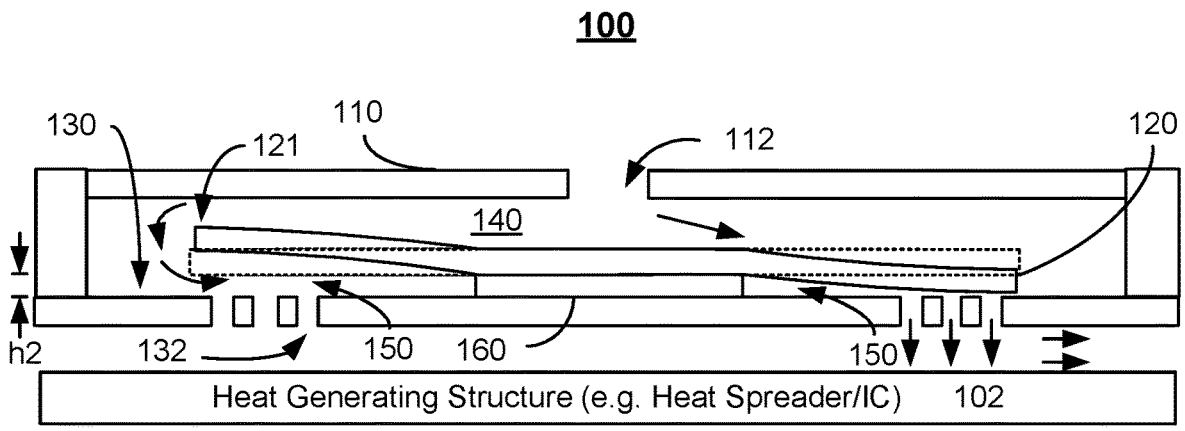
Figure 1F:
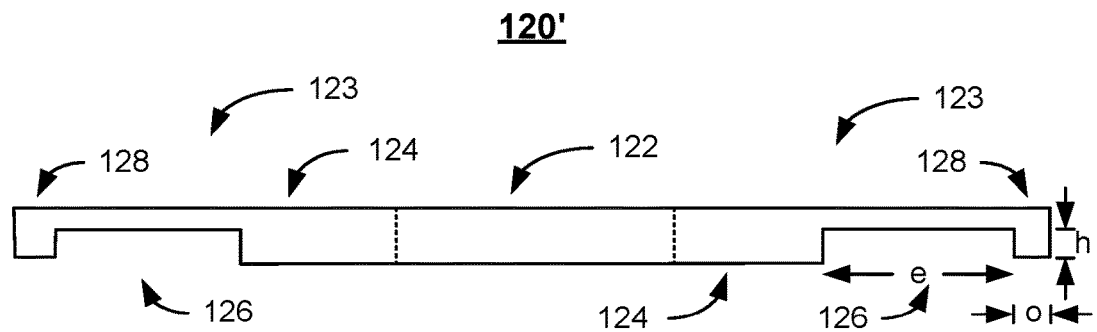

FIGS. 1A-1F are diagrams depicting an exemplary embodiment of active MEMS cooling system 100 usable with heat-generating structure 102 and including a centrally anchored cooling element 120 or 120'. Cooling element 120 is shown in FIGS. 1A-1E and cooling element 120' is shown in FIG. 1F. For clarity, only certain components are shown. FIGS. 1A-1F are not to scale. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electromechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1E). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1E, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1E. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1E) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or a Ti (e.g. a Ti alloy such as Ti6Al-4V). In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1B.

Cooling element 120 is also actuated so that tip 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C.

Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 140. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

FIGS. 1D-1E depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1D and 1E. The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1E, cooling system 100 may utilize cooling elements having different shapes. FIG. 1F depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1F, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 100 to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
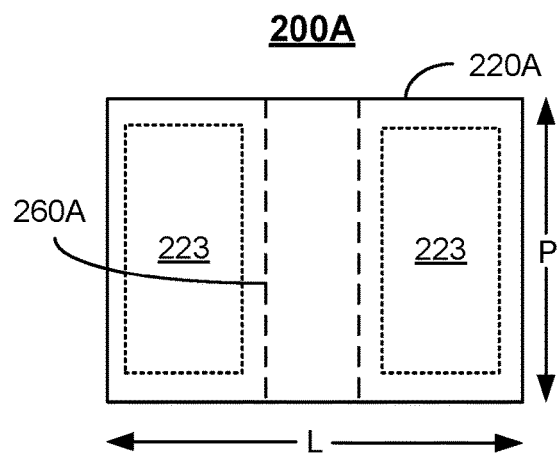
FIGS. 2A-2B depict embodiments of cooling elements usable in active MEMS cooling systems including centrally anchored cooling elements.
Figure 2B:
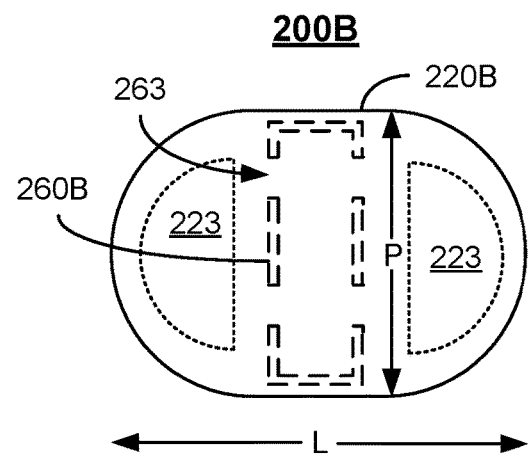

FIGS. 2A-2B depict plan views of embodiments of cooling systems 200A and 200B analogous to active MEMS cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120/120'. Thus, the sizes and/or materials used for cooling elements 220A and/or 220B may be analogous to those for cooling element 120/120'. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly (in-phase) or to a seesaw (out-of-phase). In FIGS. 2A and 2B, L is the length of the cooling element, analogous to that depicted in FIGS. 1A-1E. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. In some embodiments, piezoelectric 223 may be located in another region and/or have a different configuration. Although described in the context of a piezoelectric, another mechanism for actuating cooling elements 220A and 220B can be utilized. Such other mechanisms may be at the locations of piezoelectric 223 or may be located elsewhere. In cooling element 220A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 220A is pinned. The unpinned portions of the perimeter of cooling element 220A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220 A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112. Further, although cooling elements 200A and 200B are depicted as being supported in a central region, in some embodiments, one cantilevered section of the cooling element 220A and/or 220B might be omitted. In such embodiments, cooling element 220A and/or 220B may be considered to be supported, or anchored, at or near one edge, while at least part of at least the opposing edge is free to undergo vibrational motion. In some such embodiments, the cooling element 220A and/or 220B may include a single cantilevered section that undergoes vibrational motion.

Figure 3A:
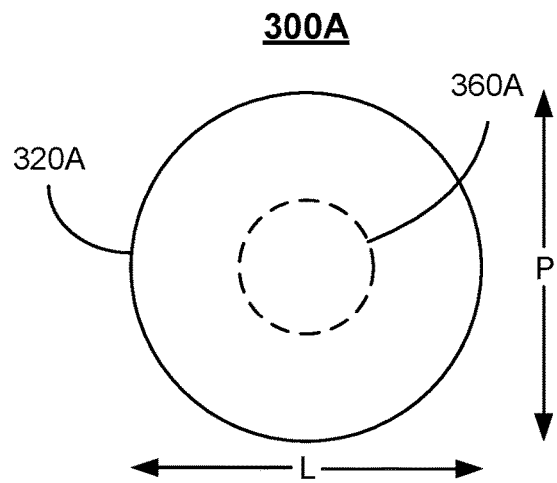
FIGS. 3A-3B depict embodiments of cooling elements usable in active MEMS cooling systems including centrally anchored cooling elements.
Figure 3B:
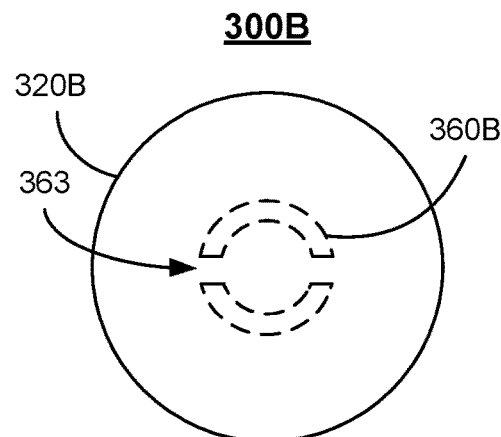

FIGS. 3A-3B depict plan views of embodiments of cooling systems 300A and 300B analogous to active MEMS cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120/120'. Thus, the sizes and/or materials used for cooling elements 320A and/or 320B may be analogous to those for cooling element 120/120'. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-1E. Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

Figure 4A:
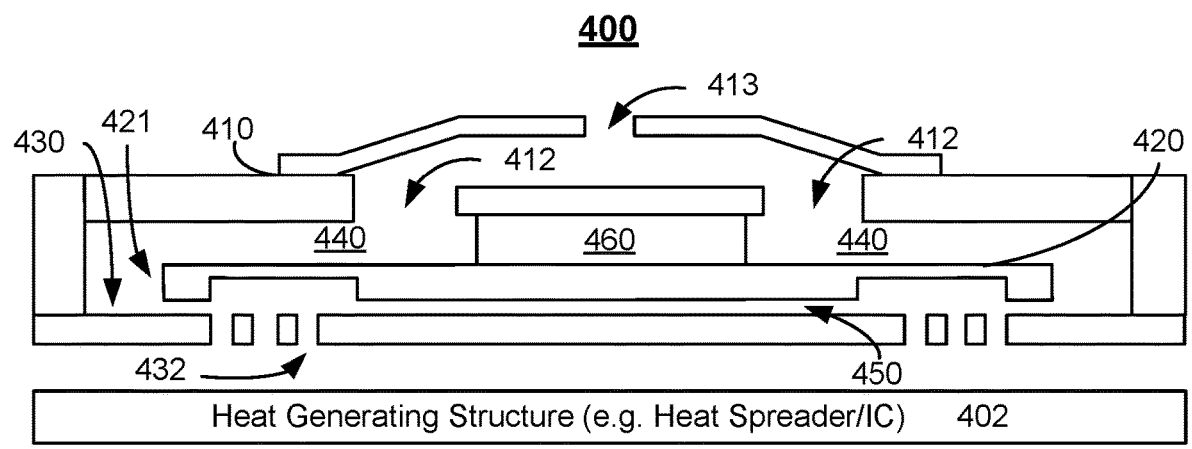
FIGS. 4A-4B depict an embodiment of an active MEMS cooling system including a centrally anchored cooling element.
Figure 4B:
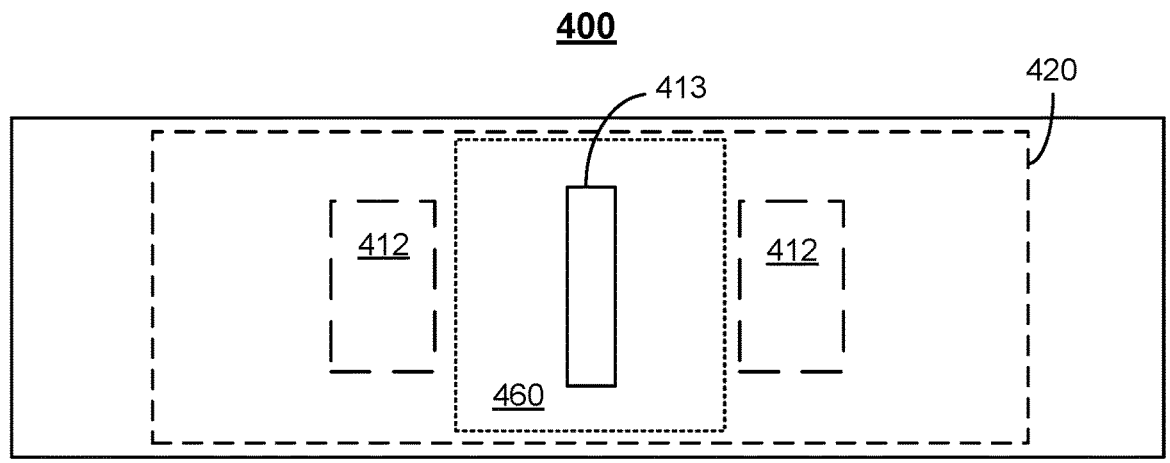

FIGS. 4A-4B depict an embodiment of active MEMS cooling system 400 including a top centrally anchored cooling element. FIG. 4A depicts a side view of cooling system 400 in a neutral position. FIG. 4B depicts a top view of cooling system 400. FIGS. 4A-4B are not to scale. For simplicity, only portions of cooling system 400 are shown. Referring to FIGS. 4A-10B, cooling system 400 is analogous to cooling system 100. Consequently, analogous components have similar labels. For example, cooling system 400 is used in conjunction with heat-generating structure 402, which is analogous to heat-generating structure 102.

Cooling system 400 includes top plate 410 having vents 412, cooling element 420 having tip 421, orifice plate 430 including orifices 432, top chamber 440 having a gap, bottom chamber 450 having a gap, flow chamber 440/450, and anchor (i.e. support structure) 460 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Thus, cooling element 420 is centrally supported by anchor 460 such that at least a portion of the perimeter of cooling element 420 is free to vibrate. In some embodiments, anchor 460 extends along the axis of cooling element 420 (e.g. in a manner analogous to anchor 260A and/or 260B). In other embodiments, anchor 460 is only near the center portion of cooling element 420 (e.g. analogous to anchor 460C and/or 460D). Although not explicitly labeled in FIGS. 4A and 4B, cooling element 420 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 420 are driven in-phase. In some embodiments, cantilevered arms of cooling element 420 are driven out-of-phase. In some embodiments, a simple cooling element, such as cooling element 120, may be used.

Anchor 460 supports cooling element 420 from above. Thus, cooling element 420 is suspended from anchor 460. Anchor 460 is suspended from top plate 410. Top plate 410 includes vent 413. Vents 412 on the sides of anchor 460 provide a path for fluid to flow into sides of chamber 440.

As discussed above with respect to cooling system 100, cooling element 420 may be driven to vibrate at or near the structural resonant frequency of cooling element 420. Further, the structural resonant frequency of cooling element 420 may be configured to align with the acoustic resonance of the chamber 440/1050. The structural and acoustic resonant frequencies are generally chosen to be in the ultrasonic range. For example, the vibrational motion of cooling element 420 may be at the frequencies described with respect to cooling system 100. Consequently, efficiency and flow rate may be enhanced. However, other frequencies may be used.

Cooling system 400 operates in an analogous manner to cooling system 100. Cooling system 400 thus shares the benefits of cooling system 100. Thus, performance of a device employing cooling system 400 may be improved. In addition, suspending cooling element 420 from anchor 460 may further enhance performance. In particular, vibrations in cooling system 400 that may affect other cooling cells (not shown), may be reduced. For example, less vibration may be induced in top plate 410 due to the motion of cooling element 420. Consequently, cross talk between cooling system 400 and other cooling systems (e.g. other cells) or other portions of the device incorporating cooling system 400 may be reduced. Thus, performance may be further enhanced.

Figure 5A:
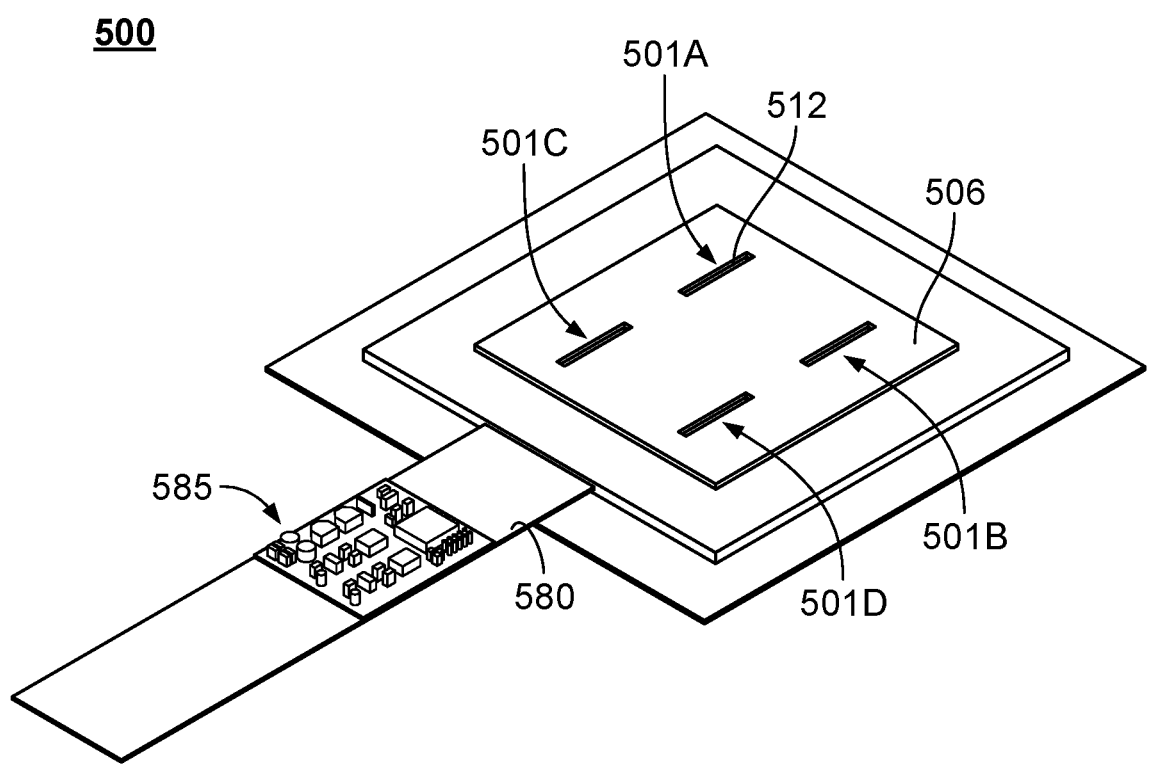
FIGS. 5A-5E depict an embodiment of an active MEMS cooling system formed in a tile.

FIGS. 5A-5E depict an embodiment of active MEMS cooling system 500 including multiple cooling cells configured as a module termed a tile, or array. FIG. 5A depicts a perspective view, while FIGS. 5B-5E depict side views. FIGS. 5A-5E are not to scale. Cooling system 500 includes four cooling cells 501A, 501B, 501C and 501D (collectively or generically 501), which are analogous to one or more of cooling systems described herein. More specifically, cooling cells 501 are analogous to cooling system 100 and/or 400. Tile 500 thus includes four cooling cells 501 (i.e. four MEMS jets). Although four cooling cells 501 in a 2×2 configuration are shown, in some embodiments another number and/or another configuration of cooling cells 501 might be employed. In the embodiment shown, cooling cells

Figure 5B:
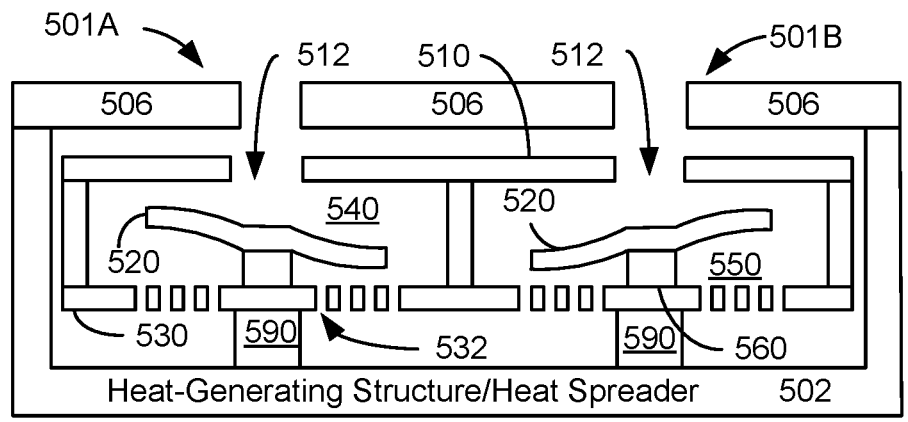
Figure 5C:
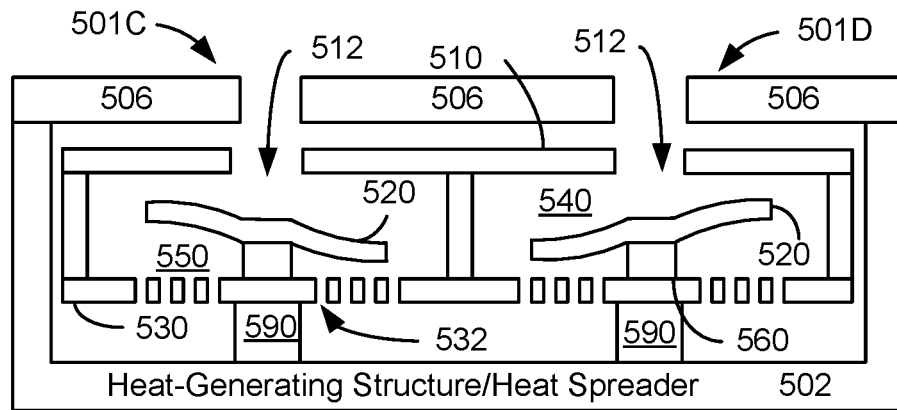
Figure 5D:
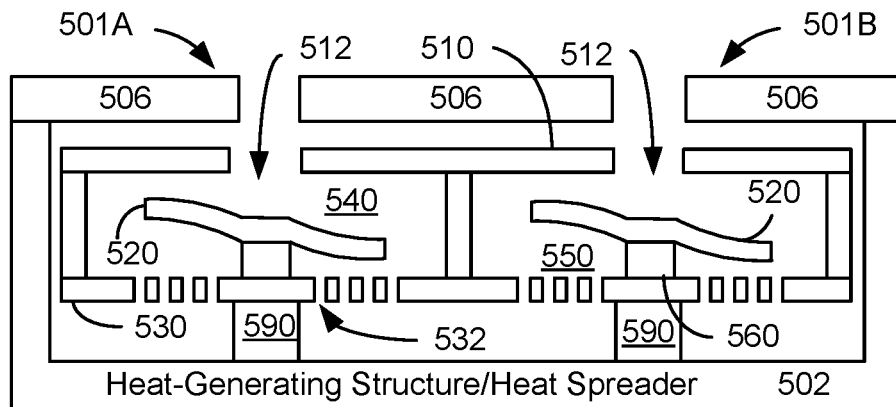
Figure 5E:
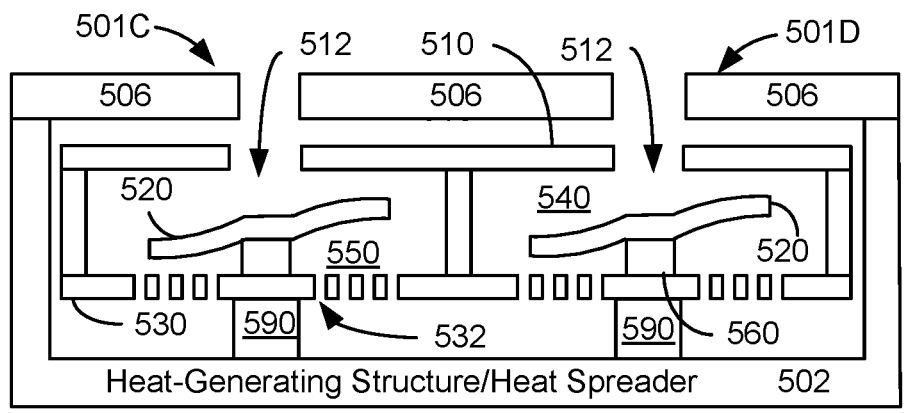

501 include shared top plate 510 having apertures 512, cooling elements 520, shared orifice plate 530 including orifices 532, top chambers 540, bottom chambers 550 and anchors (support structures) 560 that are analogous to top plate 110 having apertures 112, cooling element 120, orifice plate 130 having orifices 132, top chamber 140, bottom chamber 150 and anchor 160. In some embodiments, cooling cells 501 may be fabricated together and separated, for example by cutting through top plate 510, side walls between cooling cells 501, and orifice plate 530. Thus, although described in the context of a shared top plate 510 and shared orifice plate 530, after fabrication cooling cells 501 may be separated. In some embodiments, tabs (not shown) and/or other structures such as anchors 560, may connect cooling cells 501. Further, tile 500 includes heat-generating structure (termed a heat spreader hereinafter) 502 (e.g. a heat sink, a heat spreader, integrated circuit, or other structure) that also has sidewalls, or fencing, in the embodiment shown. Cover plate 506 is also shown. Heat spreader 502 and cover plate 506 may be part of an integrated tile 500 as shown or may be separate from tile 500 in other embodiments. Heat spreader 502 and cover plate 506 may direct fluid flow outside of cooling cells 501, provide mechanical stability, and/or provide protection. Electrical connection to cooling cells 501 is provided via flex connector 580 (not shown in FIGS. 5B-5E) which may house drive electronics 585. Cooling elements 520 are driven out-of-phase (i.e. in a manner analogous to a seesaw). Further, as can be seen in FIGS. 5B-5C and FIGS. 5D-5E cooling element 520 in one cell is driven out-of-phase with cooling element(s) 520 in adjacent cell(s). In FIGS. 5B-5C, cooling elements 520 in a row are driven out-of-phase. Thus, cooling element 520 in cell 501A is out-of-phase with cooling element 520 in cell 501B. Similarly, cooling element 520 in cell 501C is out-of-phase with cooling element 520 in cell 501D. In FIGS. 5D-5E, cooling elements 520 in a column are driven out-of-phase. Thus, cooling element 520 in cell 501A is out-of-phase with cooling element 520 in cell 501C. Similarly, cooling element 520 in cell 501B is out-of-phase with cooling element 520 in cell 501D. By driving cooling elements 520 out-of-phase, vibrations in cooling system 500 may be reduced.

Cooling cells 501 of cooling system 500 functions in an analogous manner to cooling system(s) 100, 400, and/or an analogous cooling system. Consequently, the benefits described herein may be shared by cooling system 500. Because cooling elements in nearby cells are driven out-of-phase, vibrations in cooling system 500 may be reduced. Because multiple cooling cells 501 are used, cooling system 500 may enjoy enhanced cooling capabilities. Further, multiples of individual cooling cells 501 and/or cooling system 500 may be combined in various fashions to obtain the desired footprint of cooling cells.

FIGS. 6A, 6B, 6C, 6D and 6E depict embodiments of systems 600A, 600B, 600C, and 600D, respectively, for driving active MEMS cooling systems including frequency control. For clarity, not all components are shown.

Figure 6A:
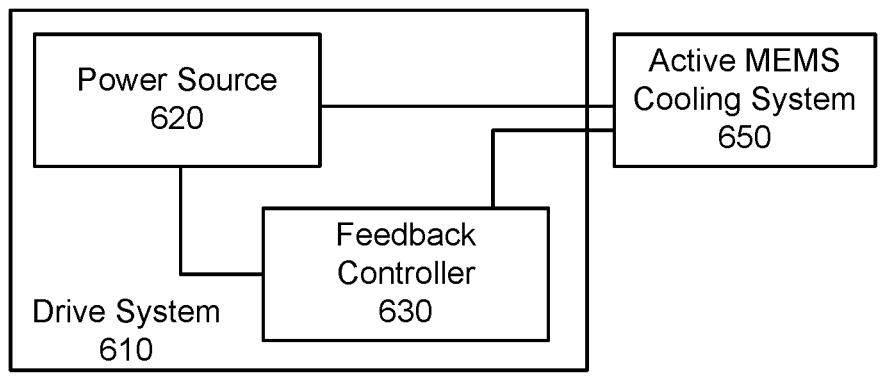
FIGS. 6A-6E depict embodiments of systems that drive active MEMS cooling systems including frequency control.

FIG. 6A depicts system 600A including drive system 610 and active MEMS cooling system 650. Cooling system 600A may be used to improve heat dissipation and power management for computing devices. Active MEMS cooling system may be a single cooling cell, such as system(s) 100, 400 and 501 or may include one or more tiles having multiple cooling cell(s), such as tile 500. Thus, the size, configuration, and operation of MEMs cooling system 650 are analogous to those described herein for system(s) 100, 400, and/or 500. For example, active MEMs cooling system 650 includes cooling elements that may be centrally anchored and are driven to vibrate. The vibration of the cooling elements may draw fluid into the cooling cells and out through orifices in an orifice plate, forming MEMs jets.

Drive system 610 is coupled to active MEMS cooling system 650 and provides driving signal(s) to active MEMS cooling system 650. Drive system 610 includes power source 620 and feedback controller 630. Power source 620 may include an alternating current (AC) or direct current (DC) power source as well as a mechanism to convert the power from such a source to an input driving signal of the desired frequency. For example, power source 620 (and thus drive system 610) may include a power supply (or other energy/power source), a square wave generator, and a low pass filter and/or band pass filter. In such embodiments, the square wave generator is coupled to a power supply and feedback controller 630. The low pass filter and/or the band pass filter are coupled to the square wave generator and active MEMS cooling system 650. In some embodiments, the low pass filter includes an inductor. The low pass filter may be used to shape the input signal to the cooling element (or actuator), for example removing higher frequency harmonics. Thus, a sine (or other) wave of a single frequency (or a limited number of frequencies) may be provided as the input driving signal to active MEMS cooling system 650. In some embodiments, the inductor and the cooling element may be configured to recapture a portion of the power provided to the cooling element. In some embodiments, drive system 610 is used to drive multiple cooling elements and/or multiple tiles. For example, active MEMS cooling system 650 may include a tile 500 or multiple tiles 500. For driving signals provided to multiple cells and/or multiple tiles using the power source, the input driving signals to each cooling element may be staggered in time in order to reduce the peak current in the square wave generator. Further, as discussed with respect to FIGS. 5A-5E, cooling cells within tiles and/or cooling cells between tiles may be driven out-of-phase using the power source and feedback controller.

Drive system 610 provides the driving signal(s) to cooling elements of active MEMS cooling system 650. In some embodiments, multiple cooling elements are driven by drive system 610. The driving signal's frequency and input voltage may be determined and provided individually for each element. In some embodiments, the frequency of the driving signal may be adjusted to correspond to the resonant state of the cooling element(s). In some embodiments, the frequency of the drive signal provided to a particular cooling cell is at or within a threshold of (e.g. one percent, two percent or five percent) of the resonant frequency of the cooling element for the cooling cell. In some embodiments, a driving signal having a particular frequency is provided to multiple cooling elements (e.g. multiple cooling cells 501). For example, drive system 610 may set the frequency and input voltage of the driving signal on a tile-by-tile basis. In such embodiments, the frequency of the drive signal corresponds to a resonant state of at least one of the cooling elements being driven or the effective resonant frequency of the tile (i.e. the multiple cooling elements and/or multiple cooling cells). Therefore, the frequency corresponding to the resonant state may include the frequency being equal to the resonant frequency for at least one of the cooling elements being driven, an average (median, or other statistical measure) of the resonant frequencies of the cooling element(s)/cell(s) being driven, or within some threshold of the resonant frequency or frequencies of the cooling element(s)/cell(s) being driven. For example, the frequency may be within one percent, two percent, or five percent of the resonant frequency of one or more of the cooling elements being driven. In some embodiments, the frequency corresponding to the resonant state includes the frequency being an average, median, mean (or other statistical measure) of the resonant frequencies of the cooling elements being driven. For example, the frequency may be within one percent, two percent, or five percent of the average of the resonant frequency/frequencies of the cooling elements being driven. The frequency at which the cooling element(s) are driven need not be equal to the resonant frequency of any single cooling element. Thus, the cooling elements being driven by the same driving signal are desired to have similar (or identical) resonant frequencies. In some embodiments, the frequency corresponding to the resonant state occurs for a minimum (or maximum) in some property related to the cooling element(s) being in resonance. For example, a minimum or maximum in particular voltage(s), current(s), or some combination thereof for the cooling element(s) may be used to identify the frequency or frequencies at which the cooling element(s) and/or tile(s) are to be driven. For example, a maximum power drawn by active MEMS cooling system 650 that is actually used to drive the cooling elements of active MEMS cooling system 650 and/or a minimum in the voltage at the piezoelectric layers of cooling elements in active MEMS cooling system 650 may be used as an indicator of resonance for cooling elements in active MEMS cooling system 650. As indicated above for frequency, being within a threshold of the maximum or minimum in the properties (e.g. voltage at the cooling element) may be used as a proxy for the resonant state. For example, the frequency selected for the driving system for active MEMS cooling system 650 may be a frequency corresponding to the voltage the active MEMS cooling system 650 being within one percent, two percent or five percent of the minimum voltage at active MEMS cooling system 650 for a particular input voltage. In some embodiments, the resonant state may be considered to provide the maximum power dissipation by active MEMS cooling system 650, as well as reduced audio noise.

Feedback controller 630 is configured to monitor one or more characteristics of system 600A, provide information related to the characteristic(s) of active MEMS cooling system 650 for example using a feedback signal, and control power source 620. In some embodiments, feedback controller 630 adjusts the frequency and/or input voltage of the driving signal provided by power source 620. Using the feedback signal, therefore, drive system 610 controls the driving signal provided to active MEMS cooling system 650. For example, feedback controller 630 may sense an output for power source 620, voltage(s) and/or current(s) at active MEMS cooling system 650. Feedback controller 630 adjusts (e.g. sets and updates) the frequency and/or input voltage based on the output. Feedback controller 630 may be viewed as sensing the proximity of MEMS cooling system 650 (and/or cooling element(s) therein) to the resonant state. Based on a feedback signal from feedback controller 630, drive system 610 can adjust the frequency of the driving signal provided by the power source 620 such that the frequency corresponds to a resonant state of the cooling element(s). In some embodiments, feedback controller 630 thus includes sense circuitry for sensing the characteristic of interest as well as a controller that uses the feedback signal to adjust the frequency provided by power source 620. Similarly, feedback controller 630 may use the feedback signal to adjust the input voltage provided by power source 620. In some embodiments, the feedback signal from feedback controller 630 is used to set and/or update the frequency provided by power source 620 so that the cooling elements are driven at (or near) the structural and/or acoustic resonant frequencies of the active MEMS cooling system (e.g. so that the cooling elements are in a resonant state).

Resonant frequencies for cooling elements may change due to a variety of factors, such as temperature and aging of the cooling element. Active MEMS cooling system 650 and cooling element(s)/cooling cell(s) therein may drift from the resonant state. Drive system 610 can use a variety of mechanisms for determining and updating the frequency or frequencies corresponding to the resonant state(s) of the cooling elements. For example, drive system 610 may sweep a range of frequencies for one or more cooling element(s) in order to determine the location of the resonant frequency or frequencies (e.g. perform a golden ratio search). In some embodiments, a pendulum sweep may be used. Feedback controller 630 might include a mechanism for determining temperature at or near the cooling elements, the age of the cooling elements and/or the history of the cooling elements in order to narrow the range of frequencies swept. Further, for active MEMS cooling system 650 including multiple cooling cells (e.g. one or more tiles), drive system 610 may selectively activate a single cooling cell or tile, sweep the frequencies for that cooling cell to identify the resonant frequency for that cell, and repeat this process for each of the remaining cooling cells. In some embodiments, drive system 610 may activate and determine the resonant frequencies for multiple cooling cells and/or multiple tiles in parallel. Thus, the cooling element has a resonant state and drive system 610 may adjust the frequency such that the cooling element approaches the resonant state. In some embodiments, drive system 610 adjusts the frequency such that power provided to the cooling element or cooling elements is increased. This increase in power drawn may correspond to the cooling element(s) approaching or reaching the resonant state. In some embodiments, drive system 610 adjusts the frequency such that the voltage(s) across the cooling element(s) are minimized.

In addition to adjusting the frequency to correspond to that of a resonant state, drive system 610 may also set the input voltage. More specifically, drive system 610 may adjust an input voltage for the cooling element(s) such that the input voltage is not less than a minimum desired operating voltage for the cooling element and does not exceed a maximum safe operating voltage for the cooling element (e.g. is within a safe operating range). In some embodiments, this is achieved by performing a sweep, described below, to determine the appropriate frequency and then a fine tuning sweep of the frequencies. In some embodiments, the input voltage is set to be a maximum that is achievable for the cooling element within the safe operating range (e.g. equal to the maximum safe operating voltage). For example, in some embodiments, once the frequency has been set by utilizing the frequency that corresponds to maximum power drawn that is used to drive the cooling element(s) (i.e. at or near resonance), feedback controller increases the power input to the cooling element to a peak power that is within the safe operating range. In some embodiments, other characteristics may be monitored by feedback controller 630. For example, the voltage provided to the cooling elements (e.g. to minimize the voltage at the cooling elements), the power output by power source 620, peak-to-peak current output by power source 620, peak voltage output by the power source 620, average current output by power source 620, RMS current output by the power source 620, average voltage output by power source 620, amplitude of displacement of the cooling element(s) in active MEMS cooling system 650, peak current through the cooling element(s) of active MEMS cooling system 650, RMS current through the cooling element(s) of active MEMS cooling system 650, peak voltage at the cooling element(s) (e.g. at active MEMS cooling system 650), average current through the cooling element(s) of active MEMS cooling system 650, average voltage at the cooling element(s) of active MEMS cooling system 650 may be monitored. In general, feedback controller 630 may be viewed as monitoring a property or properties that are a proxy for the resonant state of cooling element(s) of active MEMS cooling system 650. The resonant state of MEMS cooling system 650 (and cooling elements therein) may be considered to correspond to the maximum in thermal dissipation being provided by MEMS cooling system 650.

In the example above, where the active MEMS cooling system includes multiple cooling cells (e.g. includes one or more tiles), system 600A may selectively activate a single cooling cell, sweep the frequencies for that cooling cell to identify the resonant frequency for that cooling cell, and repeat this process for each of the remaining cooling cells. This process may take place on a tile level as well. Thus, the frequencies and input voltages may be set and properties monitored for the MEMS cooling system 650 (e.g. a tile) as a whole. In some embodiments, this process may be performed in parallel. Thus, the cooling element has a resonant state and drive system 610 may adjust the frequency such that the cooling element is at or near the resonant state. In other words, drive system 610 adjusts the frequency to correspond to the resonant state of the cooling element(s). This may be carried out at a lower input power to the cooling element. Once the frequency is determined, the drive system 610 may increase the power input to the cooling cell or tile until a peak is reached within the safe operating range is reached. The safe operating range may be predetermined, for example by a maker of the cooling cell or tile. For example, the coercive voltage (or fraction thereof) for the piezoelectric of a cooling element may be determined by the maker of the tile as the maximum safe operating voltage. In some embodiments, the safe operating range might be determined by characterizing the cells on the fly. For example, the minimum and/or maximum safe operating voltage may be such that vibrations, heat generation and/or other characteristics of the cooling cell, tile, and/or active MEMS cooling system 600A are within desired tolerance.

Thus, drive system 610 may be used to drive the cooling element(s) of active MEMS cooling system 650 at or near resonance. As a result, the benefits of the active MEMS cooling systems described herein may be achieved. Further, system 600A may be used to drive the cooling element(s) at the highest input voltage such that is within the safe operating range (at least the minimum desired operating voltage and not more than the maximum safe operating voltage). Stated differently, the peak input voltage for the cooling element that is also such that the active MEMS cooling system is within the desired operating parameters may be used. Use of a higher input voltage may increase the flow rate provided by the vibrating cooling element. Thus, the cooling abilities of system 600A may be further improved.

Figure 6B:
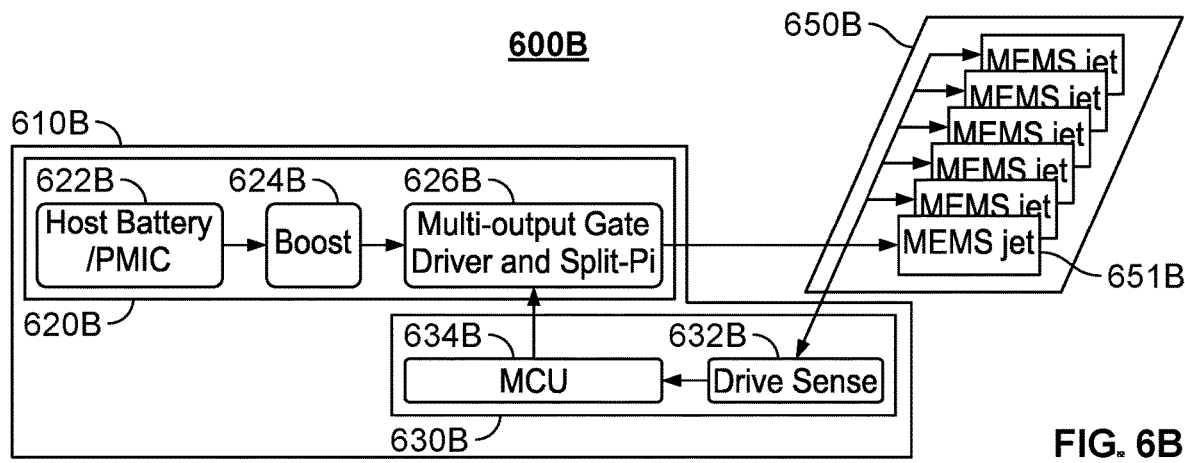

FIG. 6B depicts system 600B that drives active MEMS cooling system 650B with frequency control. System 600B includes drive system 610B and active MEMS cooling system 650B that are analogous to drive system 610 and active MEMS cooling system 650. Cooling system 600B may be used to improve heat dissipation and power management for computing devices. Active MEMS cooling system 650B includes multiple cooling cells 651B. Thus, active MEMS cooling system 650B may be a tile including six cooling cells, or MEMS jets. In some embodiments, another number of MEMS jets may be present in cooling system 650B. Active MEMS cooling system 650B might include multiple tiles, each of which has multiple MEMS jets/cooling cells. For example, six tiles (e.g. one for each MEMS jet 651B) of four cooling cells each may be driven.

Drive system 610B includes power source 620B and feedback controller 630B. Power source 620B may be considered to include the host battery or power management integrated circuit (PMIC) 622, boost 624B, and multi-output gate driver and split-pi 626B. Host batter/PMIC 622B is used to provide power. In some embodiments, power source 620B may be considered to be coupled to, instead of include, host battery/PMIC 622B. Boost 624B (e.g. a boost regulator) may be used to increase the voltage provided by host battery/PMIC 622B. In some embodiments, a power source distinct from boost 624B may be used in addition to or in lieu of boost 622B. Multi-output gate driver and split-pi 626B can be used to convert a DC signal from boost 624B to an input driving signal having the desired frequency.

Feedback controller 630B includes drive sense 632B and micro-control unit (MCU) 634B. Drive sense circuitry 632B senses the output of power source 620B and provides this sensed output to MCU 634B. Based on this sensed output (e.g. to provide a maximum in power drawn that is used to drive cooling elements of MEMS jets 651B/resonant state of one or more of MEMS jets 651B) a feedback signal is provided to MCU 634B. Based on the feedback signal, MCU 634B controls multi-output gate driver and split-pi 626B to update the frequency of the driving signal(s) provided by multi-output gate driver and split-pi 626B. The input driving voltage provided to MEMS jets 651B may also be adjusted using MCU 634B. The input driving signal at the updated frequency is provided to active MEMS cooling system 650. The updated frequency may be closer to the resonant frequency for one or more of the cooling element(s) of MEMS jets 651B.

In the embodiment shown in FIG. 6B, drive sense circuitry 632B senses output of power source 620B from the output of MEMS jets 651B. Thus, the output of power source 620B (e.g. boost 624B and multi-output gate driver and split-pi 626B) is indirectly sensed. System 600B may still be used to maximize usable power (e.g. the amount of power provided by power source 620B that goes to vibrating cooling elements) and/or drive the cooling element(s) of active MEMS cooling system 650B at or near the resonant state. System 600B may also be used to drive the cooling element(s) at the highest input voltage such that is within the safe operating range. Thus, the cooling abilities of system 600B may be further improved. As a result, the benefits of the active MEMS cooling systems described herein may be achieved.

Figure 6C:
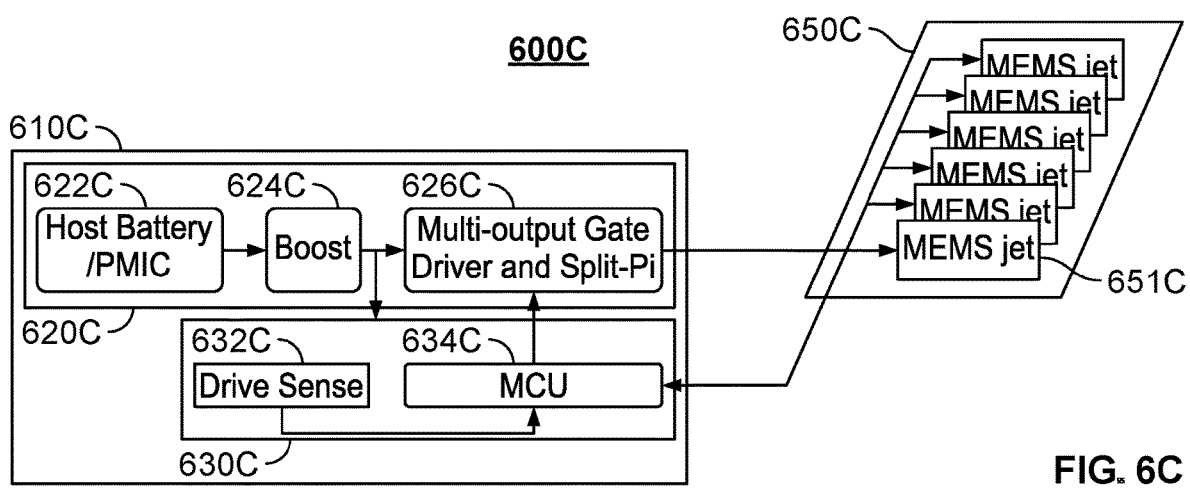

FIG. 6C depicts system 600C for driving an active MEMS cooling system with frequency control. System 600C is analogous to system 600B. Thus, analogous components have similar labels. System 600C includes drive system 610C and active MEMS cooling system 650C that are analogous to drive system 610B and active MEMs cooling system 650B. Drive system 610C includes power source 620C and feedback controller 630C analogous to power source 620B and feedback controller 630B. Thus, power source 620C includes host battery/PMIC 622C, boost 624C and multi-output gate driver and split-pi 626C that are analogous to host battery/PMIC 622B, boost 624B, and multi-output gate driver and split-pi 626B. Feedback controller 630C includes drive sense circuitry 632C and MCU 634C that are analogous to drive sense circuitry 632B and MCU 634B. However, in system 600C, the drive sense circuitry 632C is connected such that the output of the power source (i.e. the boost) is sensed directly. For example, the peak current and/or voltage may be sensed at or near power source 620C (e.g. at the boost regulator 624C). System 600C operates in a manner analogous to systems 600A and 600B. Systems 600C may thus be used to drive the cooling element(s) of active MEMS cooling system 600C at or near the resonant state. System 600C may also be used to drive the cooling element(s) at the highest input voltage such that is within the safe operating range. Thus, the cooling abilities of system 600C may be further improved. As a result, the benefits of the active MEMS cooling systems described herein may be achieved.

Figure 6D:
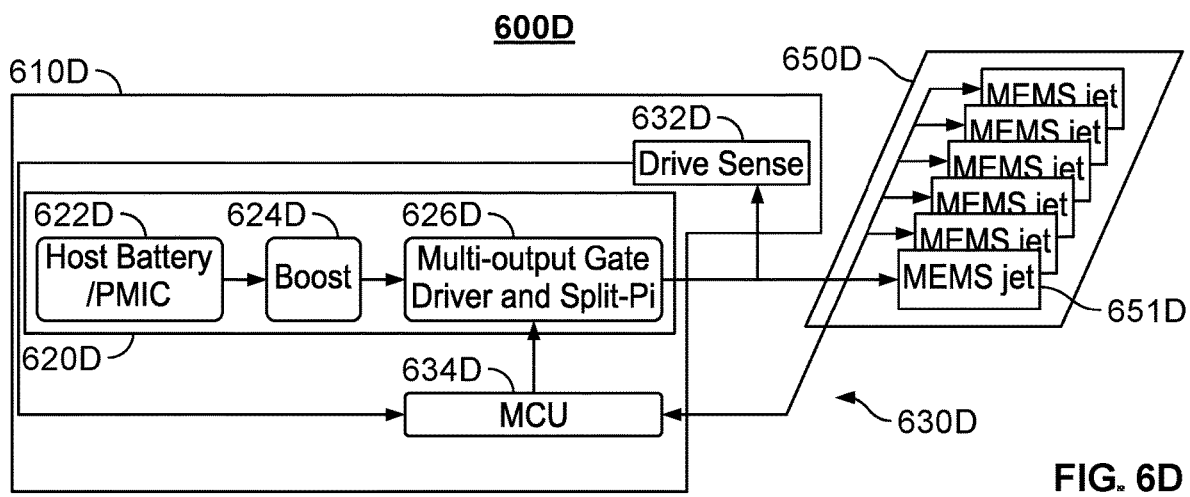

FIG. 6D depicts system 600D for driving an active MEMS cooling system with frequency control. System 600D is analogous to systems 600B and 600C. Thus, analogous components have similar labels. System 600D includes drive system 610D and active MEMS cooling system 650D that are analogous to drive system 610B/610C and active MEMs cooling system 650B/650C. Drive system 610D includes power source 620D and feedback controller 630D analogous to power source 620B/620C and feedback controller 630B/630C. Thus, power source 620D includes host battery/PMIC 622D, boost 624D, and multi-output gate driver and split-pi 626D that are analogous to host battery/PMIC 622B/622C, boost 624B/624C, and multi-output gate driver and split-pi 626B/626C. Feedback controller 630D includes drive sense circuitry 632D and MCU 634D that are analogous to drive sense circuitry 632B/632C and MCU 634B/634C. However, in system 600D, the drive sense circuitry 632D is connected such that the output of the power source 620 (i.e. boost 624D) is sensed indirectly, between the multi-outlet gate driver and split-pi 626D and active MEMS cooling system 650D. System 600D may thus be used to drive the cooling element(s) of active MEMS cooling system 600C at or near the resonant state. As a result, the benefits of the active MEMS cooling systems described herein may be achieved.

Figure 6E:
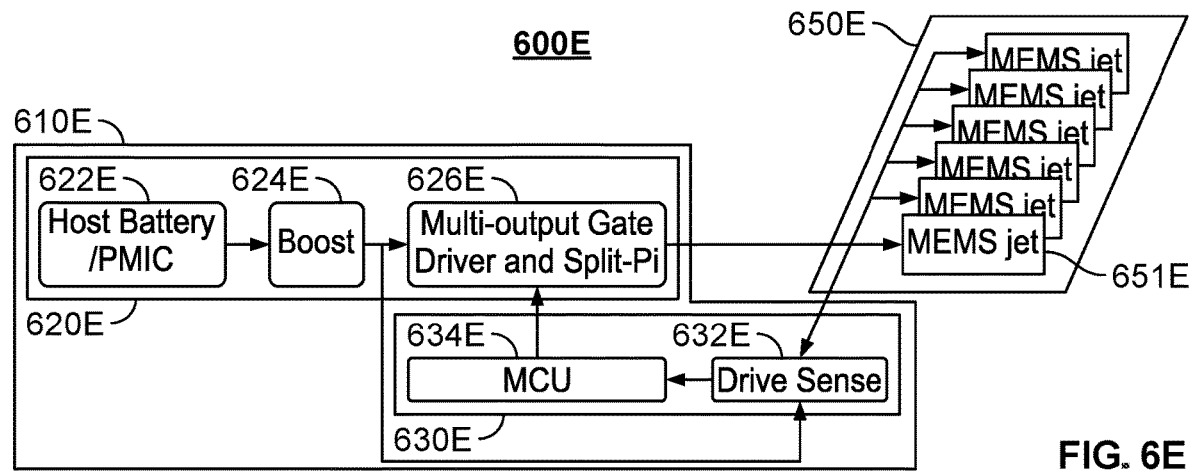

FIG. 6E depicts system 600E for driving an active MEMS cooling system with frequency control. System 600E is analogous to systems 600, 600B, 600C, and 600D. Thus, analogous components have similar labels. System 600E includes drive system 610E and active MEMS cooling system 650E that are analogous to drive system 610B/610C/610D and active MEMs cooling system 650B/650C/650D. Drive system 610E includes power source 620E and feedback controller 630E analogous to power source 620B/620C/620D and feedback controller 630B/630C/630D. Thus, power source 620E includes host battery/PMIC 622E, boost 624E, and multi-output gate driver and split-pi 626E that are analogous to host battery/PMIC 622B/622C/622D, boost 624B/624C/624D, and multi-output gate driver and split-pi 626B/626C/626D. Feedback controller 630E includes drive sense circuitry 632E and MCU 634E that are analogous to drive sense circuitry 632B/632C/632D and MCU 634B/634C/634D. However, in system 600E, feedback controller circuitry is connected such that the output of the power source (i.e. the boost) is sensed indirectly, between the multi-outlet gate driver and split-pi 626D and MEMS jets 651D. Systems 600D may thus be used to maximize power used to drive the cooling element(s) of active MEMS cooling system 600C at or near the resonant state. As a result, the benefits of the active MEMS cooling systems described herein may be achieved.

Figure 7:
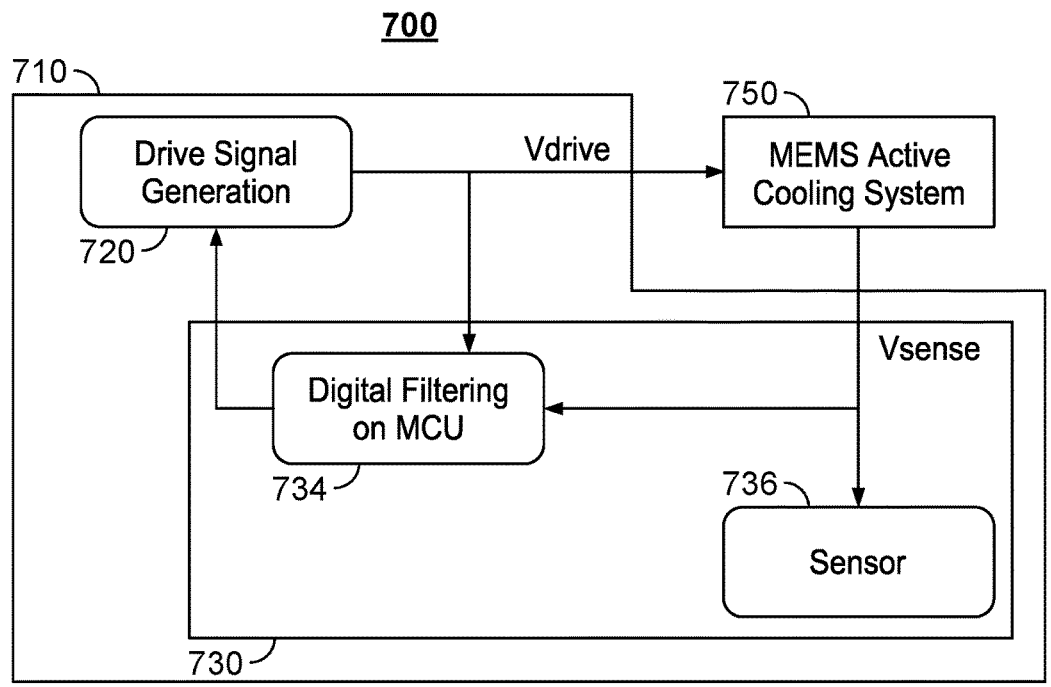
FIG. 7 depicts an embodiment of a system that drive active MEMS cooling systems including frequency control.

FIG. 7 depicts an embodiment of system 700 that drives an active MEMS cooling system with frequency control. System 700 is analogous to systems 600A, 600B, 600C, 600D, and 600E. In particular, system 700 is most closely analogous to system 600B. System 700 includes drive system 710 and active MEMS cooling system 750 (i.e. including cooling cell(s)/MEMS jet(s)) that are analogous to drive system 610B and active MEMS cooling system 650B. Drive signal generation 720 is analogous to power source 620B. MCU 734 receives the sensed quantities (e.g. Vsense and Vdrive) and may be used to update the frequency of the input driving signal provided by the drive signal generation 720. As indicated in FIG. 7, MCU 734 also performs digital filtering. Drive sense circuitry (not shown) senses the output of the power source (e.g. Vdrive) and provides this sensed output to MCU 734. Based on this sensed output, MCU 734 updates the frequency provided by multi-output gate driver and split-pi (not shown) or analogous component of drive signal generation 720. The input driving signal at the updated frequency is provided to the active MEMS cooling system 750. For example, a voltage measurement using a sensor 736 (e.g. capacitor, resistor, etc.) is made. Thus, the driving voltage Vdrive and sense voltage Vsense are measured. Filtering through analog or digital techniques may be applied to remove noise and resolve phase differences between Vdrive and Vsense. Digital filters used can be based on correlation filters such as matched filters, Goertzel filters or any similar single point FFT filters. Φ, the phase difference(s) between Vdrive and Vsense may be observed. The current consumption is calculated from Vsense and sensor 736 that is used. The power output is estimated by using power consumed by P=V I cos(Φ). This power can be used to update the frequency of the driving signal provided by the drive signal generation 720. Power (or other relevant quantity) may be maximized (or minimized, depending on the quantity) to drive the system at or near the resonant frequency of the cooling elements (e.g. such that the cooling element(s) are in a resonant state). Thus, system 700 may more efficiently drive the active MEMS cooling system at or near resonance. MCU 734 may also use the sensed quantities to increase the power source driving voltage to gain maximum cooling performance, while ensuring the input driving voltage to the cooling element remains in the safe operating range.

Figure 8:
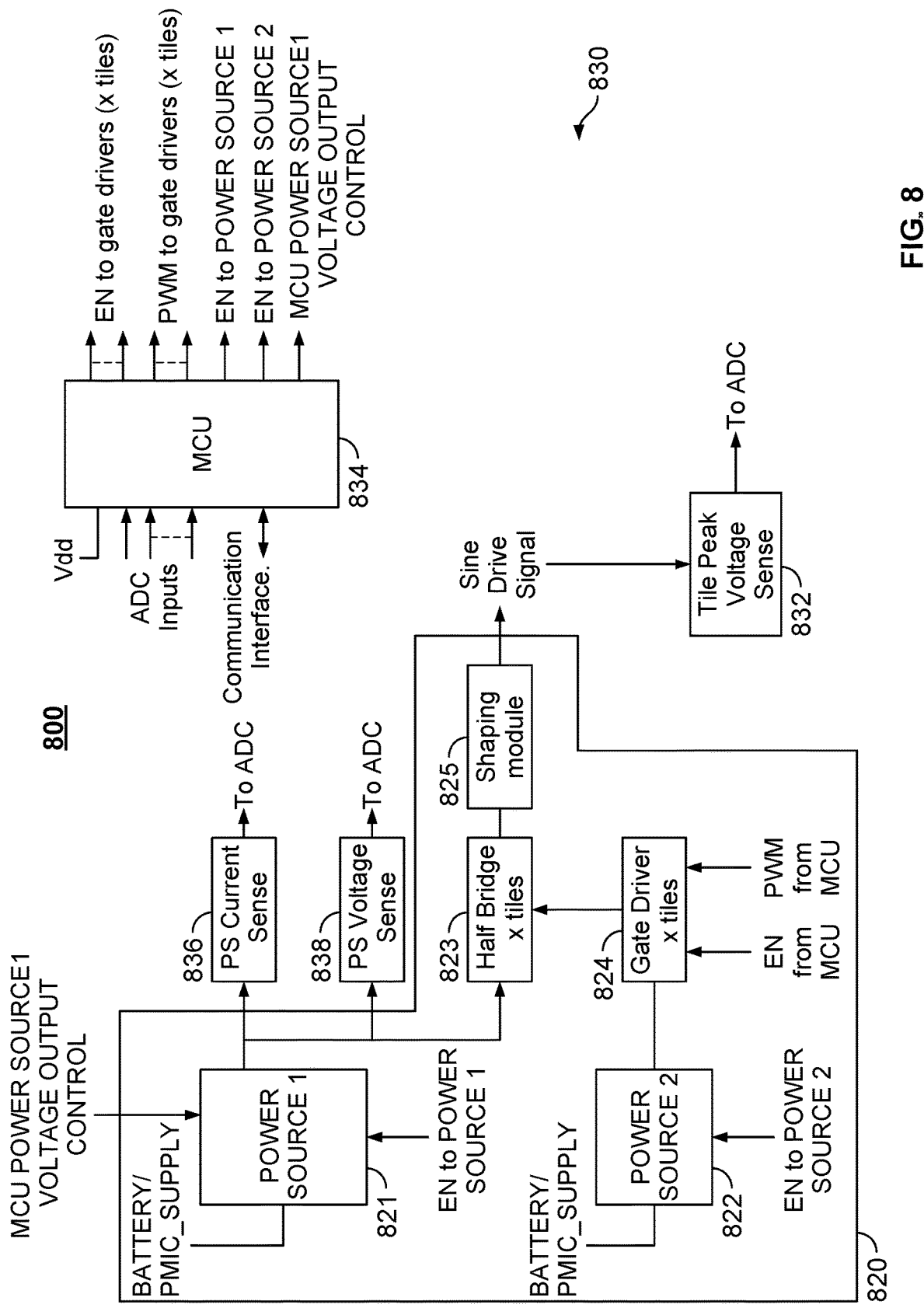
FIGS. 8-11 depict embodiments of systems for driving active MEMS cooling systems including frequency control and frequency sensing proximate to the power source.

FIG. 8 depicts an embodiment of system 800 for driving an active MEMS cooling system with frequency control. The active MEMS cooling system to which the driving signal is provided by system 800 is not shown. Such an active MEMS cooling system may be analogous to active MEMS cooling system(s) 100, 400, 500, 650, 650B, 650C, 650D, 650E, and/or 750. System 800 may thus be considered analogous to drive system 610, 610B, 610C, 610D, 610E, and/or 710. System 800 includes power source 820 and feedback controller 830 that are analogous to power source 620, 620B, 620C, 620D, 620E, and/or 720 and feedback controller 630, 630B, 630C, 630D, 630E, and/or 730. Power source 820 for system 800 may be considered to include power source 1 821, power source 2 822, the half bridge 823, the gate driver 824, and the shaping module 825. Feedback controller 830 includes tile peak voltage sense 832, MCU 834, power source (PS) current sense 836, and PS voltage sense 838. PS current sense 836, PS voltage sense 838, and tile peak voltage sense 832 may be considered to be part of the drive sense of FIGS. 6B-6E. The PS current sense 836 and PS voltage sense 838 may be used in setting the frequency and/or voltage (e.g. to correspond to a resonant state of the cooling element(s)/active MEMS cooling system). Tile peak voltage sense 832 may be used in increasing the input voltage used to drive the cooling elements in the tile while ensuring the input voltage remains in the safe operating range. The connection between MCU 834 and the remaining portions of system 800 are shown via the inputs and outputs for various components that are labeled in FIG. 8. In some embodiments, MCU 834 may control the input voltage applied to the cooling element via updating the feedback signal to the power source 1 821. In some embodiments, this feedback signal is updated via DAC circuitry (not explicitly shown in FIG. 8. The DAC circuitry may be integrated in MCU 834 or may be a discrete external component. In other embodiments, this feedback signal is updated via a digital potentiometer circuitry (not shown) external to MCU 834 but controlled from MCU 834. In other embodiments, this feedback signal is updated via an external filter circuit that is driven with a PWM signal from MCU 834.

Power source 1 821 may be a boost regulator, while power source 2 822 may be a buck regulator. Power source 1 821 provides power to the active MEMS cooling system. Power source 2 822 provides power to other components such as gate driver 824. Half bridge 823 converts the DC signal from the power source 1 821 to a square wave by switching the signal on and off at a particular frequency. Thus, half bridge 823 may be considered to be a square wave generator. MCU 834 activates half bridge 823 at a particular frequency provided via gate driver 824. Shaping module 825 may be a band pass filter, a low pass filter, or analogous component. In some embodiments, shaping module 825 includes an inductor. In some embodiments, the inductor in shaping module 825 is configured to recapture energy from the active MEMS cooling system. For example, the cooling element may include a piezoelectric which is used to drive vibrations of the cooling element. This piezoelectric is effectively a capacitor. The LC circuit including shaping module 825 and the piezoelectric of the cooling element can be used to exchange energy between the capacitor and the inductor. Thus, at least some of the energy stored by the piezoelectric capacitor can be returned to (i.e. recaptured by) the inductor and used to drive the piezoelectric during subsequent cycle(s). MCU 834 receives the sensed current and voltage via the ADC inputs. MCU 834 provides EN and PWM frequency signals to gate driver 824. MCU 834 may also communicate with the host via a communication interface such as SPI and/or I2C.

In operation, the power source 1 821 provides power to half bridge 823. Current sense 836 and voltage sense 838 measure the output of power source 1 821. Current sense 836 and voltage sense 838 provide the sensed current and voltage from power source 1 821 to MCU 834. MCU 834 utilizes these quantities to calculate the power output to the active MEMS cooling system by power source 1 821. In some embodiments, the current sensed by current sensed 836 and/or voltage sensed by voltage sense 836 are minimized for a given input voltage (e.g. voltage output by half bridge 823) when the cooling element of the active MEMS cooling system is at or near a resonant state. These minima may be considered to correspond to the maximum in power delivered to the MEMS cooling system with a minimum power returned by the MEMS cooling system and/or a minimum in power going to heating of the MEMS cooling system (or which is otherwise unusable). Stated differently, the minima may be considered to correspond to the maximum power actually used to drive the cooling elements to vibrate. Thus, based on quantities corresponding to the power used to actually drive the cooling elements, MCU 834 may update the frequency and/or input voltage at which the active MEMS cooling system is to be driven to bring the active MEMS cooling system to (or closer to) the resonant state. In some embodiments, multiple cooling elements are driven by the same driving signal (or multiple driving signals having the same frequency). For example, a driving signal having a frequency may be used to drive all cooling elements in a tile. In such embodiments, the minimum in power corresponds to the resonant state of one or more cooling elements. In such an embodiment, fewer than all of the cooling elements (including none of the cooling elements) may be driven exactly at the resonant frequency. However, the cooling elements are considered to be in a resonant state because the global power used to vibrate the cooling element(s) is maximized and the frequency used is sufficiently close to the resonant frequency of each of the cooling elements to consider the cooling elements to be in a resonant state and drive fluid as described herein.

The updated frequency is provided from MCU 834 to the PWM input of gate driver 824. Gate driver 824 updates the frequency at which half bridge 823 activates and deactivates its output signal. Thus, the frequency of the square wave is updated. Shaping module 825 shapes the output to provide the desired signal (e.g. a sine wave) at the updated frequency. The cooling element is thus driven at the updated frequency. This process may continue until the desired resonant frequency is identified and used to drive the cooling element. In some embodiments, the resonant (and thus the driving) frequency is nominally at least 23 kHz and not more than 25 kHz. Other frequencies are possible. Further, because the output of power source 1 821 is directly sensed, the calculation of the power and/or minima in current and/or voltage is simplified. Thus, system 800 may more efficiently drive the active MEMS cooling system at or near resonance. Vdd power is provided typically from a PMIC (not shown) for MCU 834 to operate. In addition, generally after the cooling element and/or tile is driven at the frequency corresponding to resonance, the voltage input to the cooling element(s)/tile is increased. This increase can be controlled by MCU 834. The voltage at the tile (e.g. at the cooling element(s)) is sensed by tile peak voltage sense and returned as an input to MCU 834. This process may be iterated in order to provide the input voltage that is optimized to be as large as achievable while both not less than the minimum desired operating voltage and not greater than the maximum safe operating voltage. Because the tiles may be driven at or near resonance at a larger input voltage, efficiency and flow rate of the fluid (e.g. air) driven by the cooling element may be improved.

Figure 9:
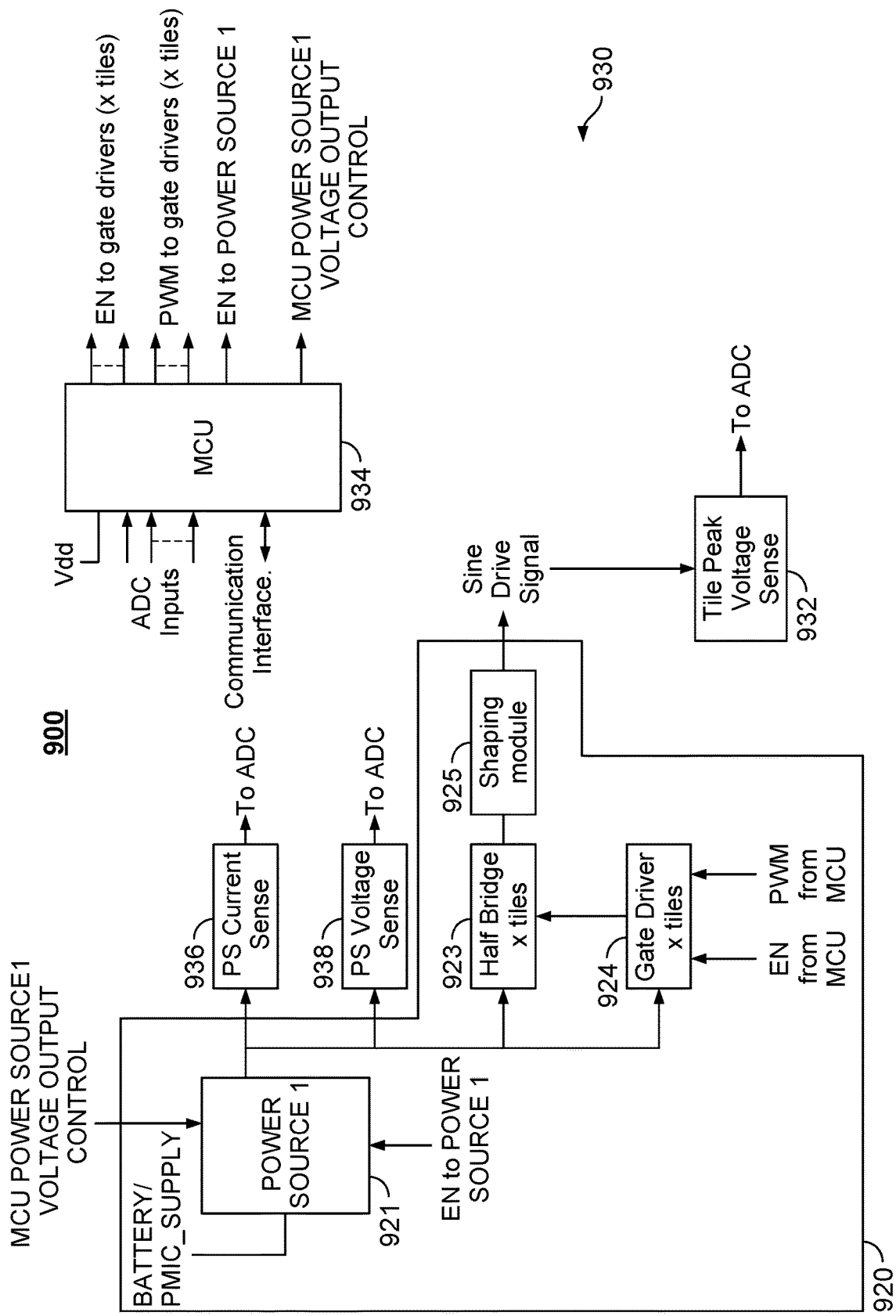

FIG. 9 depicts system 900 for driving an active MEMS cooling system with frequency control. Such an active MEMS cooling system may be analogous to active MEMS cooling system(s) 100, 400, 500, 650, 650B, 650C, 650D, 650E, and/or 750. System 900 may thus be considered analogous to drive system 610, 610B, 610C, 610D, 610E, 710 and/or 800. System 900 includes power source 920 and feedback controller 930 that are analogous to power source 620, 620B, 620C, 620D, 620E, 720 and/or 820 and feedback controller 630, 630B, 630C, 630D, 630E, 730 and/or 830. System 900 is most analogous to system 800. Power source 920 for system 900 may be considered to include power source 1 921, half bridge 923, gate driver 924, and shaping module 925 that are analogous to power source 1 821, half bridge 823, gate driver 824, and shaping module 825, respectively, of system 800. Feedback controller 930 may be considered to include tile peak voltage sense 932, MCU 934, current sense 936, and voltage sense 938 that are analogous to tile peak voltage sense 832, MCU 834, current sense 836, and voltage sense 833. The connection between MCU 934 and the remaining portions of system 900 are shown via the inputs and outputs for various components that are labeled in FIG. 9.

System 900 is analogous to system 800. However, power source 2 822 (the buck regulator) has been omitted. Thus, power source 1 (the boost regulator) 921 is used to drive not only the active MEMS cooling system via half bridge 923, but also gate driver 924. In some embodiments, the power source 921 may provide voltages of at least 3.3V through up to 5V, to the operational voltage of the tile (not shown). In some embodiments, other voltages are possible. However, system 900 operates in an analogous manner to system 800. Thus, the system 900 may efficiently drive the active MEMS cooling system at or near resonance and at a higher input voltage. Thus, flow rate (i.e. cooling power) and efficiency may be improved.

Figure 10:
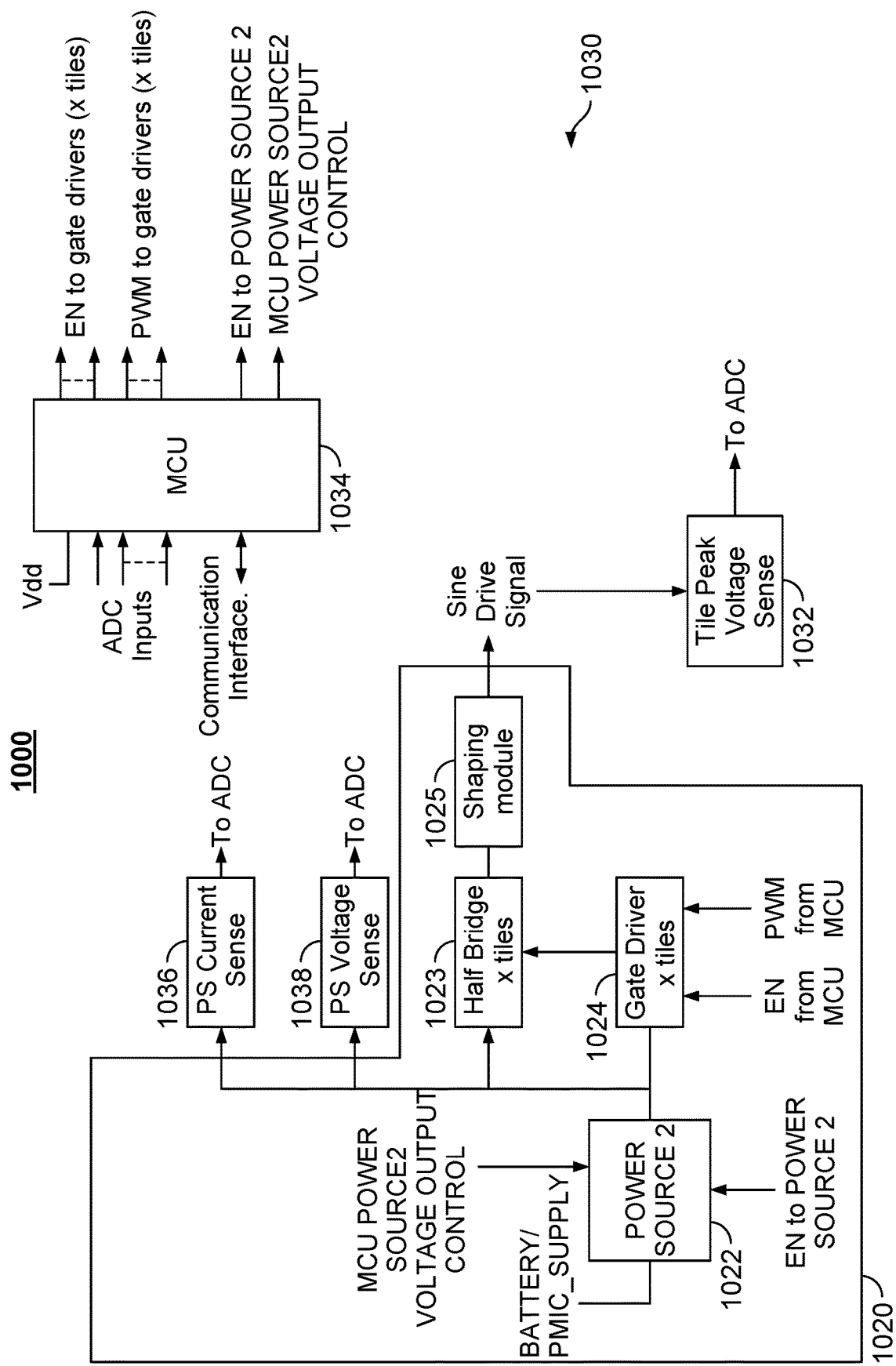

FIG. 10 depicts system 1000 for driving an active MEMS cooling system with frequency control. Such an active MEMS cooling system may be analogous to active MEMS cooling system(s) 100, 400, 500, 650, 650B, 650C, 650D, 650E, and/or 750. System 1000 may thus be considered analogous to drive system 610, 610B, 610C, 610D, 610E, 710, 800 and/or 900. System 1000 includes power source 1020 and feedback controller 1030 that are analogous to power source 620, 620B, 620C, 620D, 620E, 720, 820 and/or 920 and feedback controller 630, 630B, 630C, 630D, 630E, 730, 830 and/or 930. System 1000 is most analogous to system(s) 800 and/or 900. Power source 920 for system 800 may be considered to include power source 2 1022, half bridge 1023, gate driver 1024, and shaping module 1025 that are analogous to power source 2 822, half bridge 823/923, gate driver 824/924, and shaping module 825/925, respectively, of system(s) 800 and/or 900. Feedback controller 1030 may be considered to include tile peak voltage sense 1032, MCU 1034, current sense 1036, and voltage sense 1038 that are analogous to tile peak voltage sense 832/932, MCU 834/934, current sense 836/936, and voltage sense 838/938, respectively, of system(s) 800 and/or 900. The connection between MCU 1034 and the remaining portions of system 1000 are shown via the inputs and outputs for various components that are labeled in FIG. 10.

System 1000 is analogous to system 800 and/or 900. However, power source 1 821 (the boost regulator) has been omitted. Thus, power source 2 1022 (the buck regulator) is used to drive not only gate driver 1024 but also the active MEMS cooling system (not shown) via half bridge 1023. In some embodiments the power source 2 1022 may provide output voltages from at least the variable battery voltage to approximately a stable 11 V. In some embodiments, other voltages are possible. In addition, system 1000 and system 900 are analogous in that a single power source drives both gate driver 1024/924 and the active MEMS cooling system. Thus, in some embodiments, a power source other than the boost voltage regulator or the buck regulator might be used in system 900 and/or system 1000. System 1000 operates in an analogous manner to system 800. In addition, recapture of energy from the active MEMS cooling system via an inductor in shaping module 823 may be performed to boost the signal. Thus, the system 1000 may efficiently drive the active MEMS cooling system at or near resonance and at higher input voltages corresponding to higher flow rates.

Figure 11:
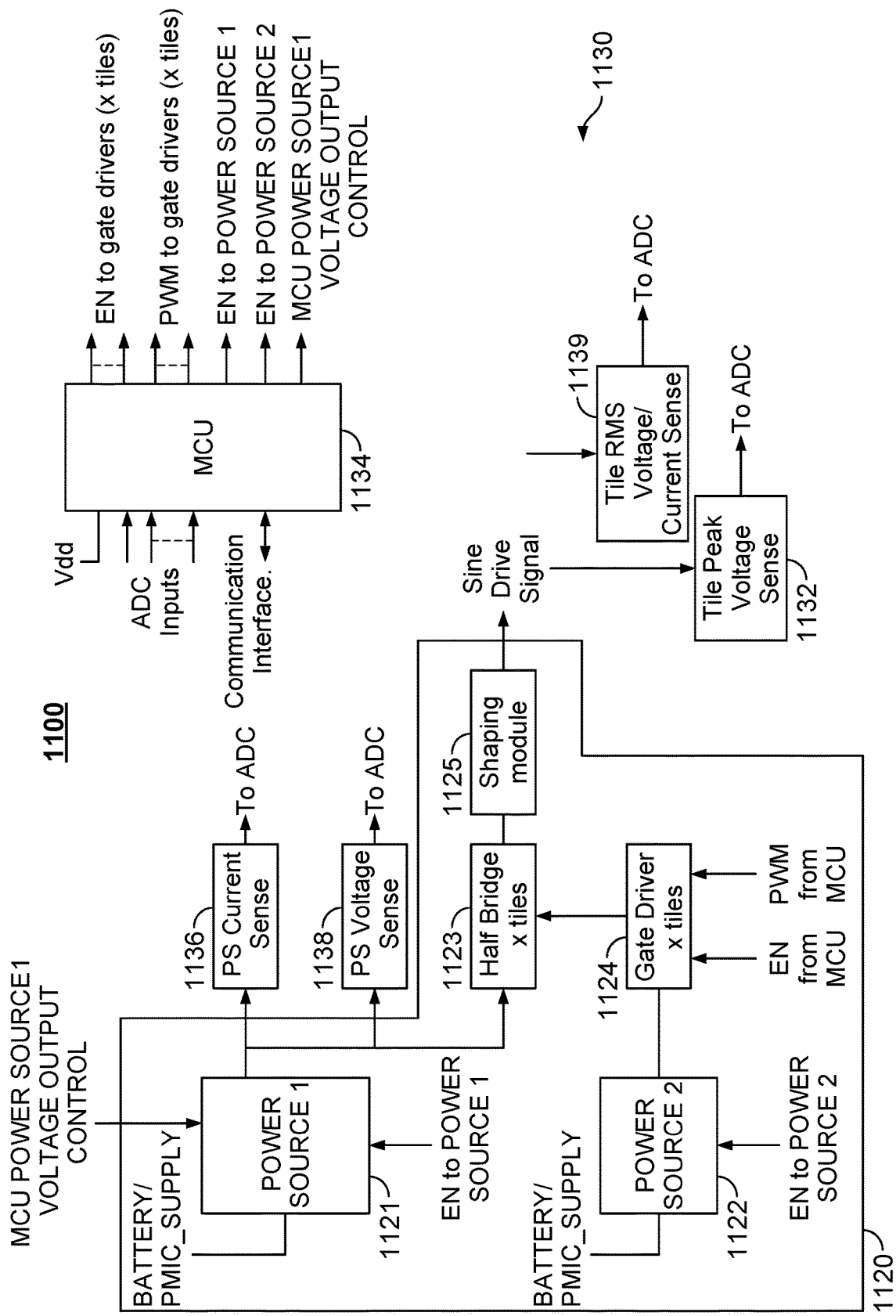

FIG. 11 depicts system 1100 for driving an active MEMS cooling system with frequency control. Such an active MEMS cooling system may be analogous to active MEMS cooling system(s) 100, 400, 500, 650, 650B, 650C, 650D, 650E, and/or 750. System 1100 may thus be considered analogous to drive system 610, 610B, 610C, 610D, 610E, 710, 800, 900 and/or 1000. System 1100 includes power source 1120 and feedback controller 1130 that are analogous to power source 620, 620B, 620C, 620D, 620E, 720, 820, 920 and/or 1020 and feedback controller 630, 630B, 630C, 630D, 630E, 730, 830, 930 and/or 1030. System 1100 is most analogous to system(s) 800, 900 and/or 100. Power source 1120 for system 1100 may be considered to include power source 1 1121, power source 2 1122, half bridge 1123, gate driver 1124, and shaping module 1125 that are analogous to power source 1 821/921, power source 2 822/1022, half bridge 823/923/1023, gate driver 824/924/1024, and shaping module 825/925/1024, respectively, of system(s) 800, 900 and/or 1000. Feedback controller 1130 may be considered to include tile peak voltage sense 1132, MCU 1134, current sense 1136, and voltage sense 1138 that are analogous to tile peak voltage sense 832/932/1032, MCU 834/934/1034, current sense 836/936/1036, and voltage sense 838/938/1038, respectively, of system(s) 800, 900 and/or 1000. Feedback controller 1130 also includes tile RMS voltage/current sense 1139. The connection between MCU 1134 and the remaining portions of system 1100 are shown via the inputs and outputs for various components that are labeled in FIG. 11.

System 1100 is analogous to system 800. However, the current and voltage sense for adjusting the frequency to correspond to resonance are also performed at the active MEMS cooling system (e.g. at the tile) by tile RMS voltage/current sense 1139. In some embodiments, system 1100 may be reconfigured in a manner analogous to 900 and 1000. System 1100 operates in an analogous manner to system 800. In addition, recapture of energy from the active MEMS cooling system via an inductor in the shaping module may be performed to boost the signal. Thus, the system 1100 may efficiently drive the active MEMS cooling system at or near resonance and at higher input voltages corresponding to higher flow rates.

Figure 12:
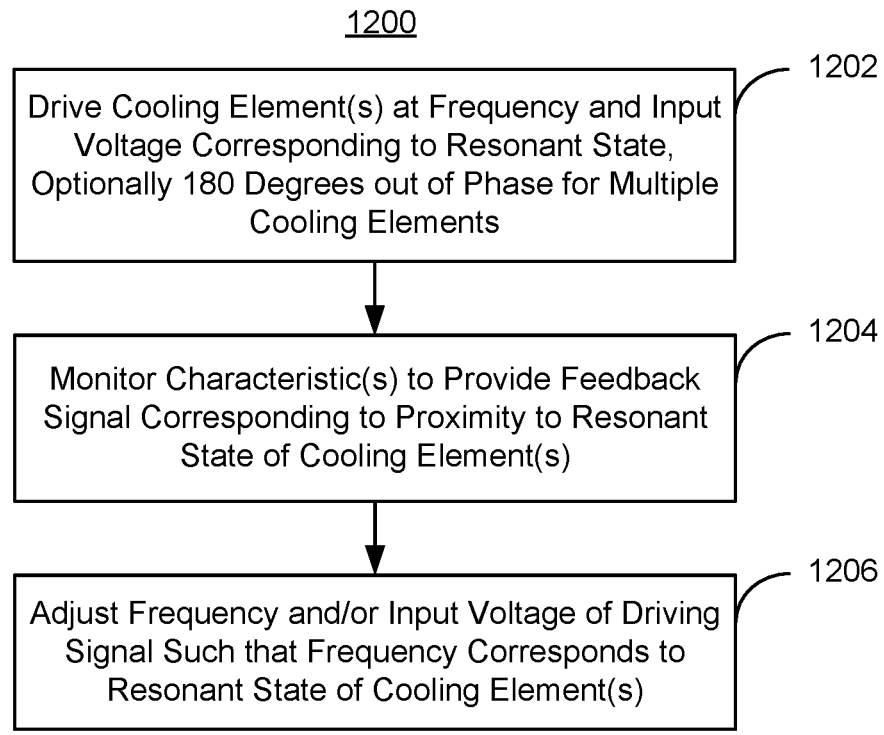
FIG. 12 is a flow chart depicting an embodiment of a method for driving an active MEMS cooling system.

FIG. 12 is a flow chart depicting an exemplary embodiment of method 1200 for operating a cooling system. Method 1200 may include steps that are not depicted for simplicity. Method 1200 is described in the context of systems 100, 500, and 600. However, method 1200 may be used with other cooling systems including but not limited to systems and cells described herein.

A driving signal at a frequency and an input voltage corresponding to the resonant state of one or more cooling elements is provided to the active MEMS cooling system, at 1202. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above. In some embodiments, the input voltage of the driving signal is also controlled at 1202 to improve performance and help prevent damage to the cooling element(s) being driven. Thus, the input voltage may be not less than (e.g. greater than) a minimum desired operating voltage for the cooling element(s) and does not exceed (e.g. is less than) a maximum safe operating voltage for the cooling element(s). The maximum safe operating voltage may be less than some fraction (e.g. ½, ⅔, ¾, or 1/1) of the coercive voltage of the piezoelectric(s) for the cooling element(s). The input voltage may be the maximum safe operating voltage while the resonant state is maintained. In some embodiments, the cooling elements include a piezoelectric. In such embodiments, the piezoelectric is used to actuate the cooling element. Piezoelectrics are generally polled during fabrication to have a particular polarization. Thus, piezoelectric(s) in the cooling elements have a polarization direction(s). In such embodiments, the providing the driving signal at 1202 may include biasing the driving signal such that the cooling element(s) are self-biased to have the polarization direction(s). For example, a particular ideal driving signal may vary at the piezoelectric from forty-five volts to negative forty-five volts. A biased driving signal may vary at the piezoelectric from sixty volts to negative thirty volts. Consequently, the driving signal may be used to retain or recapture the desired polarization of the piezoelectric(s).

Characteristic(s) of the active MEMS cooling system are monitored while the cooling element(s) are driven to provide a feedback signal corresponding to a proximity to a resonant state of the cooling element(s), at 1204. In some embodiments, characteristic(s) of each individual cooling element are monitored to determine the deviation of the frequency of vibration for that cooling element from the resonant frequency of that cooling element. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the at cooling element, average voltage at the at least one cooling element, and/or the peak current drawn by the cooling element may be monitored. Using the characteristic(s) monitored, a deviation from the resonant state of the cooling element (e.g. of the driving/vibration frequency the deviation from the resonant frequency) may be determined.

In some embodiments, characteristic(s) for multiple cooling elements are monitored at 1204. In some such embodiments, a measure of the deviation of the vibration frequency of the group of cooling elements from the resonant state of the group of cooling elements may be determined. For example, the power output by the power source, peak current output by the power source, peak voltage output by the power source, average current output by the power source, RMS current output by the power source, average voltage output by the power source, the voltage at the set of cooling elements (e.g. tile), the power drawn by set of the cooling elements, the voltage provided at the cooling elements, amplitude of displacement of the set of cooling elements, peak current through the set of cooling elements, RMS current through the set of cooling elements, peak voltage at the set of cooling elements, average current through the set of cooling elements, average voltage at the cooling element and/or the peak current drawn by the set of cooling elements may be monitored. Thus, the difference between the current state and resonant state of the set of cooling elements may be monitored. The deviation of the average (or other statistical measure) of the cooling elements' vibration frequencies from the resonant frequencies (or average resonant frequency) may be considered to be determined. In some embodiments, each cooling element in the set is monitored. For example, drive sense circuitry may be switched to alternately and individually monitor characteristics for each cooling element over a time period. Thus, a feedback signal corresponding to a proximity of the resonance state of the cooling element(s) may be provided. In some embodiments, the feedback signal is simply the measured quantity. In other embodiments, data corresponding to the characteristic(s) measured is processed to provide the feedback signal.

The frequency and/or input voltage is adjusted based on the feedback signal, at 1206. More specifically, 1206 includes updating the frequency and/or input voltage, based on the feedback signal, to correspond to resonant state(s) of the cooling element(s) at 1206. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 1206 includes determining whether the feedback signal indicates that a drift in the resonant frequency of the cooling element (s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, system 600A may use method 1200. At 1202, power source 620 provides a driving signal at a frequency to active MEMS cooling system 650. This frequency corresponds to the resonant state of the cooling element(s) of MEMS cooling system 650. Thus, the cooling elements may more efficiently cool the desired structure(s) (not shown in FIG. 6A). At 1204, feedback controller 630 monitors a characteristic of active MEMS cooling system 650 while the driving signal is being provided and the cooling element(s) are vibrating. For example, the input voltage(s) to the cooling element(s) of active MEMS cooling system 650 may be monitored by feedback controller 630. An increase in the voltage at MEMS cooling system 630 indicates that the resonant frequency of the cooling elements has drifted away from the frequency of the driving signal. Stated differently, the cooling elements in the MEMS cooling system properties have changes such that the frequency may not correspond to the resonant state of the MEMS cooling system. This may occur because of a change in temperature of the cooling element(s), aging of the cooling element(s), and/or for other reasons. At 1206, the frequency of the driving signal is adjusted. For example, if the feedback signal indicates that the resonant frequency has decreased, then the frequency of the driving signal may also be decreased at 1206.

Thus, using method 1200, an active MEMS cooling system, such as cooling system(s) 100, 400, 500, 650, 650B, 650C, 650D, 650E, and/or 750, may be efficiently driven. Further, because the characteristic(s) of the MEMS cooling system are monitored, drifts in the resonant frequency may be discovered and accounted for. Thus, method 1200 may be used to operate active MEMS cooling systems and achieve the benefits thereof.

Figure 13:
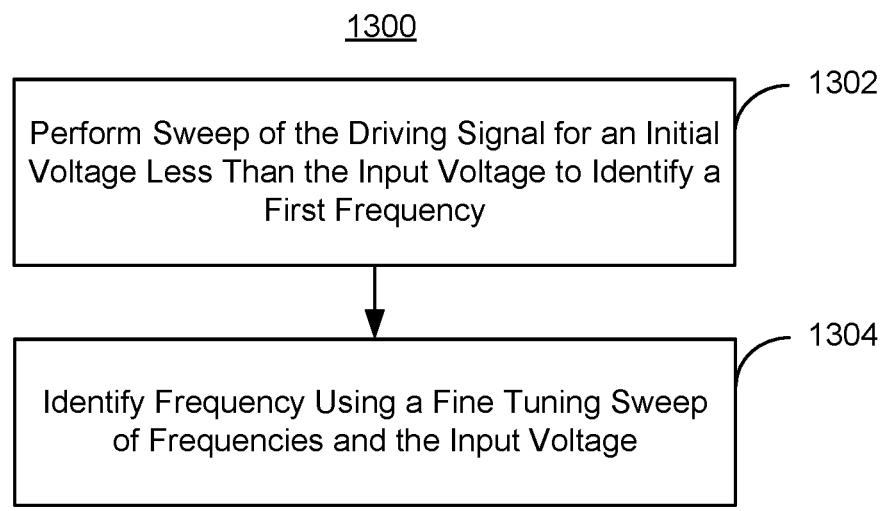
FIG. 13 is a flow chart depicting an embodiment of a method for determining parameters for driving an active MEMS cooling system.

FIG. 13 is a flow chart depicting an embodiment of method 1300 for determining parameters for driving an active MEMS cooling system. Method 1300 may include steps that are not depicted for simplicity. Method 1300 is described in the context of systems 100, 500, and 600. However, method 1300 may be used with other cooling systems including but not limited to systems and cells described herein. Method 1300 may be used to identify the frequency for the driving signal used in 1202 of method 1200. In some embodiments, method 1300 may be used adjust the frequency in 1206 of method 1200.

A first frequency corresponding to the resonant state is identified using a search of the frequencies of the driving signal, at 1302. In some embodiments, a pendulum search is used. A pendulum search of the frequencies commences at an initial frequency and alternately tests higher and lower frequencies. These frequencies may be required to be within a range in order to prevent damage to the cooling element. The initial frequency is determined based on the characteristics of the cooling element. For example, the initial frequency may be determined based on characteristics of the piezoelectric used in driving the cooling element, the geometry of the cooling element, other materials in the cooling element (e.g. stainless steel), and the desired frequency range of operation. For example, the search may be in a two kilohertz range (e.g. within approximately ten percent) of the initial frequency. In some embodiments, the initial frequency is at or near the middle of the desired frequency range of operation. The pendulum sweep may be carried out for frequencies further from the initial frequency until a monitored property indicating the resonant state, such as a minimum voltage provided to the cooling element(s), is determined. The frequency for this property is identified as the first frequency.

The pendulum search performed at 1302 may utilize an initial voltage that is less than the input voltage. Use of such an initial voltage may aid in preventing damage to the piezoelectric(s) of the cooling element(s). For example, the initial voltage and the input voltage are less than the maximum safe operating voltage. The maximum safe operating voltage is less than the coercive voltage of the piezoelectric (i.e. the voltage that will change the polarization of the piezoelectric). In some embodiments, the maximum safe operating voltage is less than two-thirds multiplied by the coercive voltage. In some embodiments, the maximum safe operating voltage is less than one-half of the coercive voltage. The initial voltage is also greater than the minimum desired operating voltage, which may be the minimum voltage sufficient to actuate the cooling element(s) in the desired range of frequencies. For example, the initial voltage may be on the order of one-half (e.g. one-third through two-thirds) of the expected input voltage.

The frequency is identified using a fine tuning sweep at the input voltage, at 1304. 1304 may be performed because the change in the applied voltage may alter operation of the cooling element(s). In some embodiments, 1304 includes driving the active MEMS cooling system at the input voltage while sweeping the frequency of the driving signal over a smaller range of frequencies that includes the first frequency determined in 1302. For example, the smaller range of frequencies may be limited to a range of 1 kHz or to within a particular threshold of the first frequency. The frequency may be at (or near) a maximum in the voltage provided to the cooling element(s) for the input voltage. This frequency corresponds to the resonant state of the cooling element(s). Thus, the input voltage at the frequency identified at 1304 may be the maximum voltage not greater than the maximum safe operating voltage for which the resonant state may be maintained.

For example, method 1300 may be used with system 600A. Suppose the resonant frequency of the cooling element(s) of active MEMS cooling system 650 is expected to be in the range of 22 kHz to 26 kHz. Further, the desired peak-to-peak voltage provided at the cooling element, which may be measured by feedback controller 630, may be ninety volts. The expected input voltage for such a system may be forty-five volts (e.g. the voltage varies between positive and negative forty-five volts). At 1302, a pendulum search may be commenced with the driving signal having an initial input voltage of twenty volts (significantly less than the expected input voltage) and an initial frequency of 24 kHz (i.e. at or near the middle of the expected frequency range). The driving signal frequency is varied in a pendulum fashion. For example, MEMS cooling system 650 may be driven at twenty volts at 24 kHz, 23.9 KHz, at 24.1 kHz, at 23.8 KHz, at 24.2 kHz, and so on. The allowed range of the sweep may be from 23 kHz through 25 kHz. At each frequency, one or more characteristics are monitored to determine whether MEMS cooling system 650 is closer to or further from resonance. For example, the power drawn by, current and/or voltage output by the power source, voltage at the cooling element, and/or other proxy for resonance in active MEMS cooling system 650 are monitored. The frequency for which the voltage(s) at the cooling elements are minimized (or close to minimized—e.g. within a threshold of one, two, or five percent) is identified as the first frequency at 1302. Suppose this frequency is 24.3 kHz. For the desired input voltage at the cooling element of forty-five volts, the initial voltage is desired to be raised by a factor of 2.25 (forty-five volts divided by twenty volts). Thus, the power source voltage (the voltage from boost 624B, 624C, 624C, or 624E for the driving signal) is forty-five volts. If a reduced amount of cooling is desired, a lower power source voltage may be used. For example, the input voltage may be raised to thirty or thirty-five volts. For an unbiased driving signal, the driving signal input voltage may vary between forty-five volts and negative forty-five volts. In some embodiments, the driving signal is biased. Such a bias may allow for self-polling of the piezoelectric. In such embodiments, the driving signal may be offset in the desired direction (e.g. may vary between sixty-five volts and negative twenty-five volts).

At 1304, a fine tuning sweep is performed of the driving signal in a range including the first frequency (24.3 kHz) at the input voltage of forty-five volts. The range is smaller than the range of allowed frequencies for the pendulum sweep. For example, the range may be from 24 kHz to 25 kHz. This fine tuning sweep is performed because changes in the operating characteristics of the cooling element(s) may change the resonant frequency. In some embodiments, the sweep is from one end of the frequency range to another (e.g. from 24 kHz to 25 kHz). In some embodiments, a pendulum sweep may be used. A minimum in the voltage provided at the cooling element(s) may again be used to identify the resonant state and the corresponding frequency. Thus, using method 1300, the frequency corresponding to the resonant state of the cooling element(s) may be found.

Using method 1300, the frequency corresponding to the resonant state of the cooling element(s) may be determined. Thus, active MEMS cooling systems may be driven in a more efficient manner. Further, damage to the cooling elements may be prevented. Thus, performance and reliability may be improved.

Figure 14:
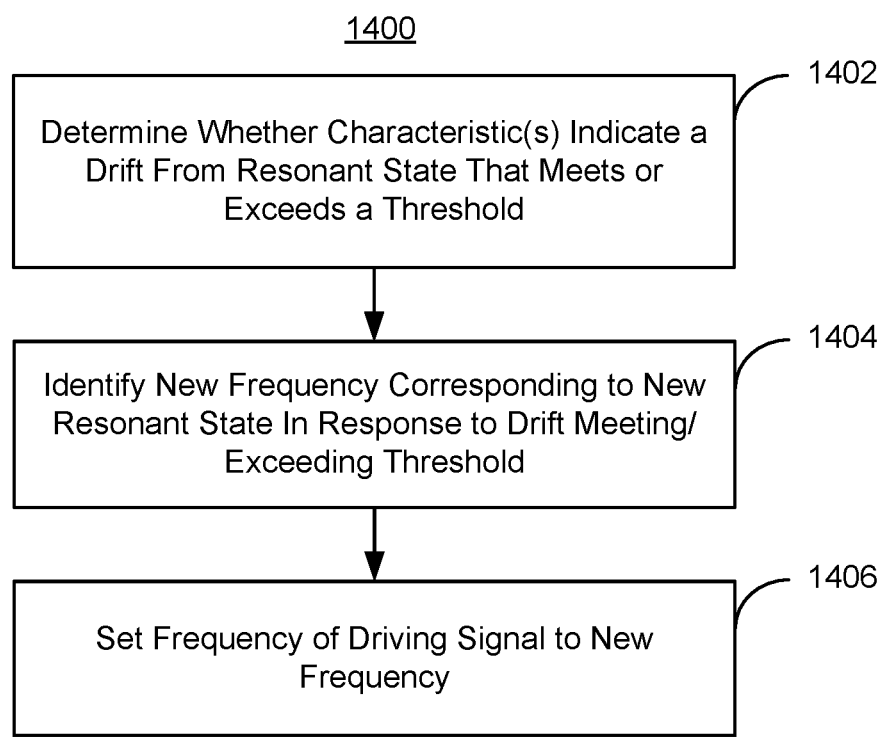
FIG. 14 is a flow chart depicting an embodiment of a method for adjusting the frequency of a driving signal for an active MEMS cooling system.

FIG. 14 is a flow chart depicting an embodiment of method 1400 for adjusting the frequency of a driving signal for an active MEMS cooling system. Method 1400 may include steps that are not depicted for simplicity. Method 1400 is described in the context of systems 100, 500, and

600. However, method 1400 may be used with other cooling systems including but not limited to systems and cells described herein.

It is determined whether characteristic(s) of the active MEMS cooling system indicate that the cooling element(s) are no longer in or sufficiently close to a resonant state for the frequency used, at 1402. As previously discussed, changes in temperature or other parameters may affect the resonant frequencies of the cooling elements. In some embodiments, 1402 includes monitoring one or more characteristics of the system, such as the voltage at the cooling elements. In some embodiments, the monitoring is continuous. In some embodiments, the monitoring may be periodic. The parameter may be periodically checked at 1402 to determine whether a threshold has been met or exceeded. For example, 1402 may determine whether the voltage(s) across the cooling element(s) meets or exceeds the threshold once per minute. In some embodiments, the characteristic(s) are monitored continuously but checked only after particular interval(s) have expired. In some embodiments, the threshold is a particular value. In some embodiments, the threshold may be expressed as a fraction of the previously determined value.

In response to a determination that the threshold has been met or exceeded, a new frequency corresponding to the resonant state is determined, at 1404. In some embodiments, a sweep analogous to the fine tuning sweep of 1304 may be performed at 1404. The new frequency may be identified as the frequency for which the voltage at the cooling element(s) is a minimum. In some embodiments, other and/or additional characteristics described herein (e.g. current at the cooling element(s) and/or other measure of the maximum power used to actually drive the cooling element(s)) may be used to determine the new frequency corresponding to the (new) resonant state. If no minimum is found (i.e. a point at which one or more frequencies above and below the frequency have higher voltages at the cooling element), then the endpoint of the range having the lowest voltage at the cooling element(s) may be determined to be the new frequency. In some embodiments, the sweep is extended to a larger range of frequencies until a minimum is found. At 1406, the frequency of the driving signal is set to the new frequency.

For example, frequency controller 630 of system 600A may monitor the characteristic(s), such as power drawn, current, and/or voltage at the cooling element. At particular times (e.g. periodically at one second time intervals, 3 second time intervals, at one minute time intervals, at two minute time intervals, and/or at five minute time intervals), frequency controller 630 determines whether the power drawn and/or voltage at the cooling element have changed from previously measured values by more than a threshold. For example, every minute, feedback controller 630 may determine whether the voltage at the cooling element (e.g. set to forty-five volts) has changed by at least and/or more than three volts or a fraction of the previously measured value (e.g. more than one percent, three percent or five percent). If the voltage at the cooling element has changed by more than the threshold, then a frequency range near the frequency of the driving signal is scanned and a new frequency identified, at 1404. For example, the new frequency may be one for which the voltage at the cooling element(s) is minimized. Feedback controller 630 controls drive system 610 to set the frequency of the driving signal to the new frequency, at 1406.

Using method 1400, changes in the resonant frequencies of the cooling elements may be accounted for. As a result, the active MEMS cooling system may be maintained at or near resonance. Thus, cooling efficiency may be improved.

Figure 15:
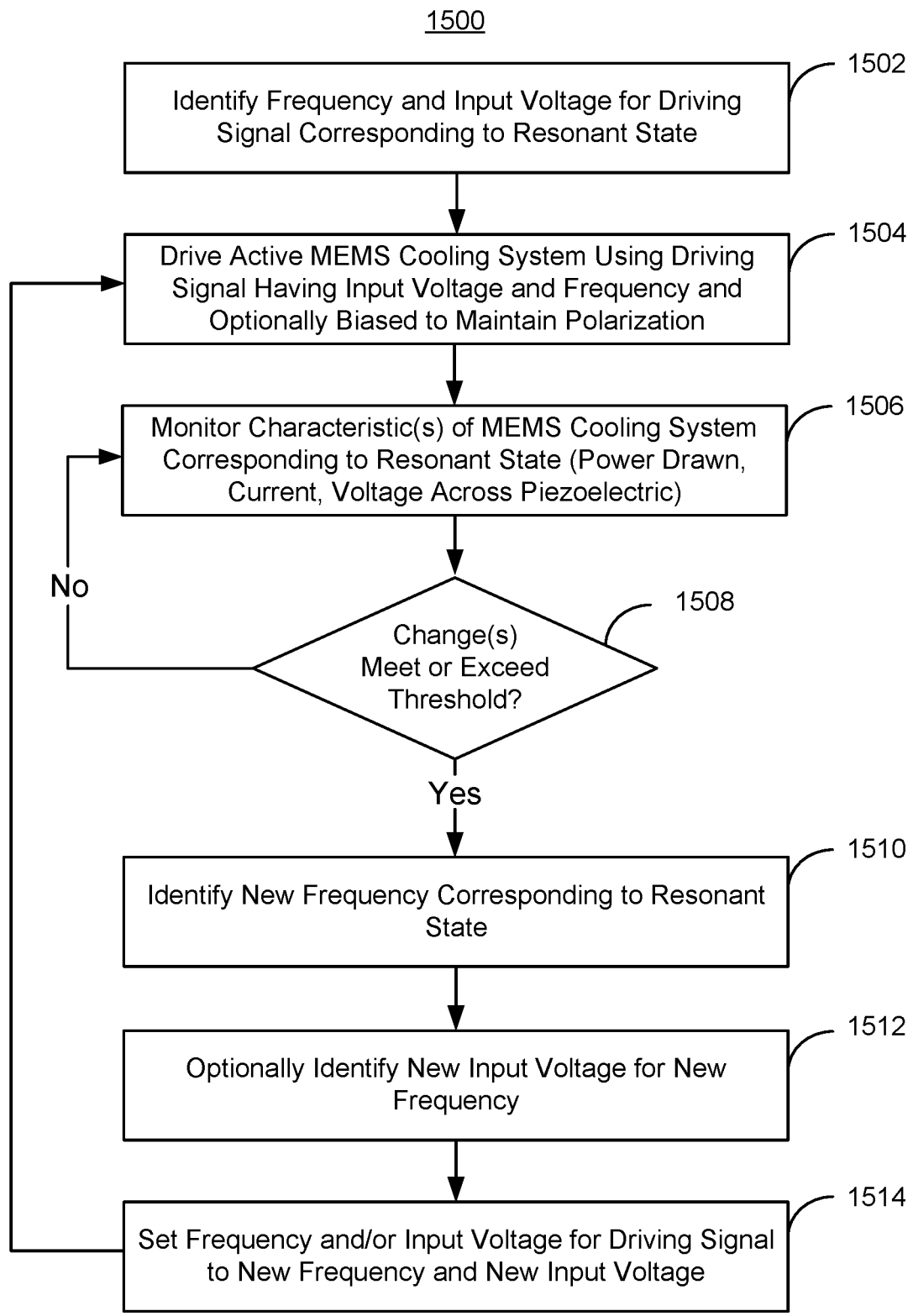
FIG. 15 is a flow chart depicting a method for driving an active MEMS cooling system.

FIG. 15 is a flow chart depicting a method for driving an active MEMS cooling system. Method 1500 may include steps that are not depicted for simplicity. Method 1500 is described in the context of systems 100, 500, and 600. However, method 1500 may be used with other cooling systems including but not limited to systems and cells described herein.

The frequency corresponding to the resonant state of the cooling element(s) (or MEMS jets) being driven and the input voltage are determined, at 1502. In some embodiments, 1502 is performed using method 1300. The active MEMS cooling system is driven using the frequency and input voltage, at 1504. In some embodiments, 1504 also includes biasing the driving signal. In some embodiments, the cooling element(s) are driven by providing electric signals to piezoelectric(s) that are connected to or incorporated into the cooling element(s). During fabrication, piezoelectrics are typically polled to align their polarization. The bias in the driving signal provided at 1504 aids in allowing the piezoelectric(s) to be self-polling. Thus, the bias may reduce the probability that the piezoelectric(s) will lose their polarization and/or may aid in the piezoelectric(s) regaining their desired polarization.

One or more characteristics of the system are monitored, at 1506. In some embodiments, the monitoring is continuous. In some embodiment, monitoring is periodic. The characteristic(s) monitored relate to the proximity of the resonance state of the cooling element(s). Thus, the characteristic(s) indicate whether the cooling element(s) are in the resonant state.

It is determined whether changes in the characteristic(s) meet or exceed threshold(s), at 1508. Thus, 1508 is analogous to 1402 of method 1400. The threshold(s) may be for individual characteristic(s) and/or for some combination of the characteristics. If the threshold is not met (or exceeded), then monitoring continues at 1506 while the cooling elements continue to be driven at the same frequency. If it is determined that the change(s) in the characteristics meets (or exceeds in some embodiments) the threshold, then a new frequency corresponding to the resonant state is identified, at 1510. In some embodiments, 1510 is analogous to 1404 of method 1400. In some embodiments, a new (e.g. larger) input voltage is identified, at 1512. For example, 1510 and 1512 may be carried out using pendulum sweep(s), fine tuning sweep(s), or pendulum and fine tuning sweeps analogous to those of method 1300. In some embodiments, other technique(s) may be used in 1510 and 1512. The frequency and (optionally) input voltage for the driving signal are set to the new values, at 1514. The cooling element(s) are thus driven again, at 1504.

Using method 1500, active MEMS cooling systems may be driven at or near resonance for a longer period of time. Further, the input driving signal may be large. Thus, the benefits of active MEMS cooling system(s), such as 100, 400, and 500, may be achieved.

Figure 16:
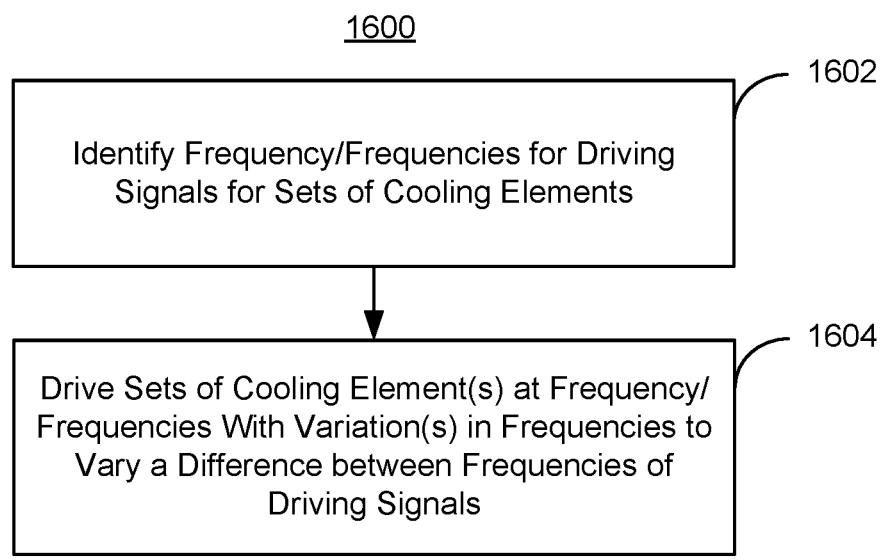
FIG. 16 is a flow chart depicting a method for driving multiple active MEMS cooling systems.

FIG. 16 is a flow chart depicting a method for driving multiple active MEMS cooling systems. Method 1600 may include steps that are not depicted for simplicity. Method 1600 is described in the context of systems 100, 500, and 600. However, method 1600 may be used with other cooling systems including but not limited to systems and cells described herein. Method 1600 may be used for multiple sets of MEMS jets being driven at different frequencies. For example, method 1600 may be used for two or more tiles, each of which may be driven by a driving signal having a separately determined frequency. As indicated previously, cooling elements in a single tile are generally desired to have resonant frequencies that are very close or the same. Thus, multiple tiles may have resonant frequencies that are similar. If multiple tiles are driven at frequencies that are close (e.g. within five percent) and are in physical proximity, the motion of the cooling elements in their resonant state and the resulting motion of the tiles may disturb the surrounding fluid (e.g. air). Because the motion of the cooling elements and tiles may be periodic, the disturbance to the surrounding fluid may be periodic. The motion of the air due to the tiles may form waves that constructively interfere (e.g. forming beats). In some cases, the interference may be audible. For example, users may hear the beats resulting from the constructive interference from two tiles driven at frequencies that are close. This is undesirable. Method 1600 may be used to address this phenomenon.

The frequencies for the driving signals of the sets (e.g. tiles) of MEMS jets (e.g. cooling cells) are determined, at 1602. In some embodiments, 1602 is performed using method 1300.

The sets of MEM jets are driven using the drive signals having frequencies that vary near the frequencies identified in 1602, at 1604. The variation in the frequencies is such that the difference(s) between the frequencies varies. In some embodiments, 1604 is performed such that the difference(s) between the frequencies is randomized. For example, at 1604, a varying offset may be periodically added to each of the frequencies. The offset is desired to be small such that each of the MEMS cooling systems remains in a resonant state. In some embodiments, the varying offset is not more than one percent of the frequencies. In some such embodiments, the offset is not more than one half of one percent of the frequency. In some embodiments, the offset is greater than zero and not more than 100 Hz. The frequencies are also changed sufficiently often to reduce or avoid the occurrence of beats. For example, the offset may change every 10 milliseconds, 100 milliseconds, or 1 second. Although not indicated in FIG. 16, the frequencies may also be updated in a manner analogous to that described for method(s) 1200, 1400, and/or 1500. Thus, the resonant state for the sets of MEMS jets may be maintained while varying the frequency difference between sets of MEMS jets.

For example, suppose active MEMS cooling system 650 includes two tiles 500. At 1602, the frequencies corresponding to the resonant state(s) of the cooling elements of the two tiles 500 are determined. The driving signal for the first tile may have a frequency of 24 kHz, while the driving signal for the second tile may have a frequency of 24.5 kHz identified at 1602. Such close frequencies (a difference of 500 Hz) might result in audible beats in the absence of method 1600. At 1604, during driving of the MEMS cooling system 650, a varying (e.g. randomized) offset of not more than 100 Hz may be incorporated into each of the frequencies every ten milliseconds. For example, after ten milliseconds, the frequencies may be 24.1 kHz and 24.45 kHz; after 20 milliseconds, the frequencies may be 24.06 kHz and 24.4 kHz. This process may continue during operation of tiles 500.

Thus, using method 1600, nearby sets of cooling elements (e.g. tiles) may be driven at close frequencies without developing audible constructive interference. Thus, the benefits of cooling system 500 may be achieved without increased noise audible to the user. Consequently performance may be improved.

Various configurations, methods and features have been described herein. Some or all of the configurations, methods and/or features may be combined in manners not explicitly described here. For example, method 1600 may be used in connection with method 1500. Thus, the desired thermal dissipation and low audio noise may be achieved in some embodiments.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
an active micro-electric mechanical system (MEMS) cooling system including at least one cooling element configured to direct a fluid to cool at least one heat-generating structure when driven to vibrate by a driving signal having a frequency and an input voltage, wherein the at least one cooling element has a first cantilevered region, a second cantilevered region, and a central region between the first cantilevered region and the second cantilevered region, the first cantilevered region and the second cantilevered region being configured to vibrate when driven; and
a drive system coupled to the active MEMS cooling system for providing the driving signal, the drive system including a power source for the driving signal and a feedback controller having a feedback signal corresponding to a proximity to a resonant state of the at least one cooling element, the drive system being configured to adjust at least one of the frequency and the input voltage based on the feedback signal such that the frequency and the input voltage correspond to the resonant state of the at least one cooling element, wherein the input voltage does not exceed a maximum safe operating voltage for the at least one cooling element.

2. The system of claim 1, wherein the drive system is configured to adjust the input voltage to be the maximum safe operating voltage for the at least one cooling element.

3. The system of claim 1, wherein the drive system is configured to adjust the frequency to correspond to a power drawn by the active MEMS cooling system and utilized by the active MEMS cooling system to vibrate the at least one cooling element being maximized.

4. The system of claim 1, wherein the frequency corresponding to the resonant state includes the frequency being at least one of an average, a median, a mean, or an other statistical measure of at least one resonant frequency of the at least one cooling element.

5. The system of claim 1, wherein the at least one cooling element includes a plurality of cooling elements.

6. The system of claim 1, further comprising:
an additional active MEMS cooling system including at least one additional cooling element configured to direct the fluid to cool the at least one heat-generating structure when driven to vibrate by an additional driving signal having an additional frequency and an additional input voltage; and
wherein the drive system is coupled to the additional active MEMS cooling system and is configured to provide the additional driving signal, to adjust at least one of the additional frequency and the additional input voltage such that the additional frequency and the additional input voltage correspond to an additional resonant state of the at least one additional cooling element, and to adjust the additional input voltage such that the additional input voltage does not exceed an additional maximum safe operating voltage for the at least one additional cooling element.

7. The system of claim 6, wherein the frequency and the additional frequency are the same.

8. A method, comprising:
providing a driving signal to an active micro-electronic mechanical system (MEMS) cooling system, the active MEMS cooling system including at least one cooling element configured to direct a fluid to cool at least one heat-generating structure when driven to vibrate by the driving signal having a frequency and an input voltage, the input voltage for the at least one cooling element not exceeding a maximum safe operating voltage for the at least one cooling element, wherein the at least one cooling element has a first cantilevered region, a second cantilevered region, and central region between the first cantilevered region and the second cantilevered region, the first cantilevered region and the second cantilevered region being configured to vibrate when driven:

monitoring a characteristic of the active MEMS cooling system to provide a feedback signal corresponding to a proximity to a resonant state of the active MEMS cooling system; and adjusting at least one of the frequency and the input voltage based on the feedback signal such that the frequency corresponds to the resonant state of the active MEMS cooling system.

9. The method of claim 8, wherein the frequency corresponding to the resonant state includes the frequency being at least one of an average, a median, a mean, or another statistical measure of at least one resonant frequency of the at least one cooling element.

10. The method of claim 8, wherein the monitoring further includes:

monitoring at least one of power drawn by the at least one cooling element, the voltage at the at least one cooling element, current drawn by the at least one cooling element, a power output by a power source providing the driving signal, a peak current output by the power source, a peak voltage output by the power source, an average current output by the power source, a root mean square (RMS) current output by the power source, an average voltage output by the power source, an amplitude of displacement of the at least one cooling element, a peak current through the at least one cooling element, an RMS current through the at least one cooling element, a peak voltage at the at least one cooling element, average current through the at least one cooling element, or an average voltage at the at least one cooling element.

11. The method of claim 8, wherein the at least one cooling element includes a plurality of cooling elements.

12. The method of claim 8, further comprising:
providing an additional driving signal to an additional MEMS cooling system including at least one additional cooling element configured to direct the fluid to cool the at least one heat-generating structure when driven to vibrate by the additional driving signal having an additional frequency; and wherein at least one of the providing the driving signal and providing the additional driving signal includes changing at least one of the frequency and the additional frequency to vary a difference between the frequency and the additional frequency.

13. The method of claim 12, wherein the frequency and the additional frequency are the same.

* * * * *